(12) United States Patent
Nishihata et al.

(10) Patent No.: US 11,990,391 B2
(45) Date of Patent: May 21, 2024

(54) SEMICONDUCTOR DEVICE

(71) Applicant: DENSO CORPORATION, Kariya (JP)

(72) Inventors: Masayoshi Nishihata, Kariya (JP); Shota Yoshikawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 441 days.

(21) Appl. No.: 17/475,102

(22) Filed: Sep. 14, 2021

(65) Prior Publication Data
US 2022/0005750 A1    Jan. 6, 2022

Related U.S. Application Data

(63) Continuation of application No. PCT/JP2020/004299, filed on Feb. 5, 2020.

(30) Foreign Application Priority Data

Mar. 19, 2019   (JP) ................................ 2019-051427

(51) Int. Cl.
*H01L 23/492* (2006.01)
*H01L 23/31* (2006.01)
(Continued)

(52) U.S. Cl.
CPC ........ *H01L 23/492* (2013.01); *H01L 23/3107* (2013.01); *H01L 23/367* (2013.01); *H01L 25/072* (2013.01)

(58) Field of Classification Search
CPC ..... H01L 23/051; H01L 23/36; H01L 23/367; H01L 23/3735; H01L 23/492;
(Continued)

(56) References Cited

U.S. PATENT DOCUMENTS

2007/0252169 A1   11/2007   Tokuyama et al.
2010/0165577 A1   7/2010   Tokuyama et al.
(Continued)

FOREIGN PATENT DOCUMENTS

JP            4532303 B2      8/2010
JP         2015-185749 A     10/2015
(Continued)

*Primary Examiner* — Fazli Erdem
(74) *Attorney, Agent, or Firm* — POSZ LAW GROUP, PLC

(57) ABSTRACT

In a semiconductor device, a first metal plate faces a first semiconductor element and a second semiconductor element and is electrically connected to a second terminal. A second metal plate faces the first metal plate while interposing the first semiconductor element between the first and second metal plates, and is electrically connected to a first terminal. A third metal plate faces the first metal plate while interposing the second semiconductor element between the first and third metal plates. The first semiconductor element has an electrode on a surface adjacent to the second metal plate and electrically connected to the second metal plate, and an electrode on a surface adjacent to the first metal plate and electrically connected to the third metal plate. The first semiconductor element is thermally connected to the first metal plate while being electrically insulated from the first metal plate by an insulator.

20 Claims, 16 Drawing Sheets

(51) Int. Cl.
*H01L 23/367* (2006.01)
*H01L 25/07* (2006.01)

(58) Field of Classification Search
CPC ........... H01L 23/3107; H01L 23/49562; H01L 23/49575; H01L 23/4334; H01L 23/5385; H01L 25/072
USPC ........................................................ 257/133
See application file for complete search history.

(56) References Cited

U.S. PATENT DOCUMENTS

| | | |
|---|---|---|
| 2011/0037166 A1* | 2/2011 | Ikeda ...................... H01L 24/73 |
| | | 257/E23.101 |
| 2012/0008280 A1 | 1/2012 | Tokuyama et al. |
| 2014/0035112 A1 | 2/2014 | Kadoguchi et al. |
| 2014/0233204 A1 | 8/2014 | Tokuyama et al. |
| 2015/0131232 A1 | 5/2015 | Ishino et al. |
| 2019/0252307 A1* | 8/2019 | Kawashima ........ H01L 23/3736 |
| 2019/0279961 A1* | 9/2019 | Iwasaki ............. H01L 23/49844 |

FOREIGN PATENT DOCUMENTS

| | | |
|---|---|---|
| JP | 6181136 B2 | 8/2017 |
| JP | 2018-101666 A | 6/2018 |

* cited by examiner

SEMICONDUCTOR DEVICE

CROSS REFERENCE TO RELATED APPLICATIONS

The present application is a continuation application of International Patent Application No. PCT/JP2020/004299 filed on Feb. 5, 2020, which designated the U.S. and claims the benefit of priority from Japanese Patent Application No. 2019-051427 filed on Mar. 19, 2019. The entire disclosures of all of the above applications are incorporated herein by reference.

TECHNICAL FIELD

The present disclosure relates to a semiconductor device.

BACKGROUND

As an example of a semiconductor device, there is an electric circuit device in which a positive electrode and a negative electrode are stacked on top of another. The semiconductor device further includes an intermediate electrode stacked on the positive electrode and the negative electrode for stacking the positive electrode and the negative electrode.

SUMMARY

The present disclosure describes a semiconductor device having a configuration capable of reducing inductance while suppressing an increase in body size.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
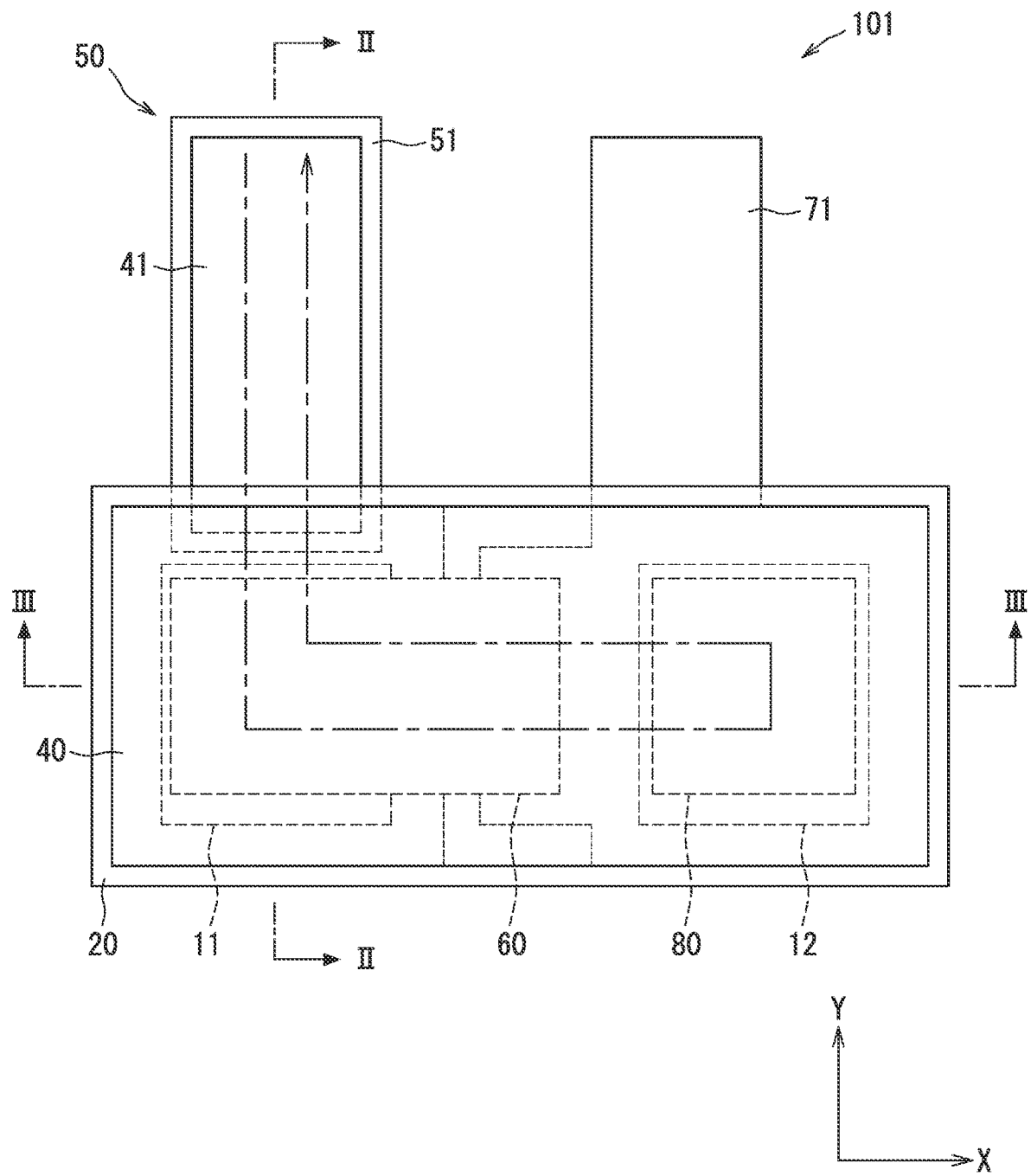
FIG. 1 is a plan view showing a schematic configuration of a semiconductor device according to a first embodiment.

In an electric circuit device in which a positive electrode and a negative electrode are stacked, inductance of wiring can be expected to be reduced by stacking the positive electrode and the negative electrode on top of another. In a case where the electric circuit device has an intermediate electrode in addition to the positive electrode and the negative electrode, the electric circuit device is likely to be increased in body size.

The present disclosure provides a semiconductor device capable of suppressing an increase in body size while reducing an inductance.

According to a first aspect of the present disclosure, a semiconductor device includes: a first semiconductor element; a second semiconductor element connected in series with the first semiconductor element; a first terminal; a second terminal, the second terminal and the first terminal allowing a current to flow between the second terminal and the first terminal; a first metal plate arranged to face both the first semiconductor element and the second semiconductor element and electrically connected to the second terminal; a second metal plate arranged to face the first metal plate and to interpose the first semiconductor element between the first metal plate and the second metal plate, and electrically connected to the first terminal; and a third metal plate arranged to face the first metal plate and to interpose the second semiconductor element between the first metal plate and the third metal plate. The second semiconductor element has a first electrode on a surface adjacent to the third metal plate and electrically connected to the third metal plate, and a second electrode on a surface adjacent to the first metal plate and electrically connected to the first metal plate. The first semiconductor element has a first electrode on a surface adjacent to the second metal plate and electrically connected to the second metal plate, and a second electrode on a surface adjacent to the first metal plate and electrically connected to the third metal plate. The first semiconductor element is thermally connected to the first metal plate while being electrically insulated from the first metal plate by an insulator.

In the configuration according to the first aspect, a current flows from the first terminal to the second terminal or from the second terminal to the first terminal. In the former case, a current path is formed so that the current flows in the order of the first terminal, the second metal plate, the first semiconductor element, the third metal plate, the second semiconductor element, the first metal plate, and the second terminal. In the latter case, a current path is formed so that the current flows in the order of the second terminal, the first metal plate, the second semiconductor element, the third metal plate, the first semiconductor element, the second metal plate, and the first terminal.

A section of the current path from the second metal plate to the third metal plate is arranged to face a section of the current path of the first metal plate, and flow directions of the sections of the current paths are opposite to each other. Therefore, in the current path from the first terminal to the second terminal, the current paths are arranged so as to face each other, and the sections in which the flow directions of the currents are opposite can be increased. As such, the inductance of wiring can be reduced. Further, since the inductance can be reduced without using an intermediate electrode, it is possible to suppress the increase in body size.

According to a second aspect of the present disclosure, a semiconductor device includes: a first semiconductor element; a second semiconductor element connected in series with the first semiconductor element; a first terminal; a second terminal, the second terminal and the first terminal allowing a current to flow between the second terminal and the first terminal; a first metal plate arranged to face both the first semiconductor element and the second semiconductor element and electrically connected to the first terminal; and a second metal plate arranged to face both the first semiconductor element and the second semiconductor element and to interpose the first semiconductor element and the second semiconductor element between the first metal plate and the second metal plate. The first semiconductor element has a first electrode on a surface adjacent to the first metal plate and electrically connected to the first metal plate, and a second electrode on a surface adjacent to the second metal plate and electrically connected to the second metal plate, the first semiconductor element is electrically connected to the first terminal via the first metal plate. The second semiconductor element has a first electrode on a surface adjacent to the second metal plate and electrically connected to the second metal plate, and a second electrode on a surface adjacent to the first metal plate and electrically connected to the second terminal. The second semiconductor element is thermally connected to the first metal plate while being insulated from the first metal plate by an insulator.

In the configuration according to the second aspect, a current flows from the first terminal to the second terminal or from the second terminal to the first terminal. In the former case, a current path is formed so that the current flows in the order of the first terminal, the first metal plate, the first semiconductor element, the second metal plate, the second semiconductor element, and the second terminal. In the latter case, a current path is formed so that the current flows in the order of the second terminal, the second semiconductor element, the second metal plate, the first semiconductor element, the first metal plate, and the first terminal.

A section of the current path of the first metal plate is arranged to face a section of the current path of the second metal plate, and flow directions of the sections of the current paths are opposite to each other. Therefore, in the current path from the first terminal to the second terminal, the current paths are arranged so as to face each other, and the sections in which the flow directions of the currents are opposite can be increased. As such, the inductance of wiring can be reduced. Further, since the inductance can be reduced without using an intermediate electrode, it is possible to suppress the increase in body size.

Hereinafter, multiple embodiments of the present disclosure will be described with reference to the drawings. In the embodiments, the same or corresponding parts will be designated with the same reference numbers, and descriptions thereof will not be repeated. In each embodiment, when only a part of the configuration is described, the other parts can be referred to and applied to those described in the preceding embodiments. Hereinafter, three directions mutually orthogonal to each other are denoted as an X direction, a Y direction, and a Z direction.

First Embodiment

Figure 2:
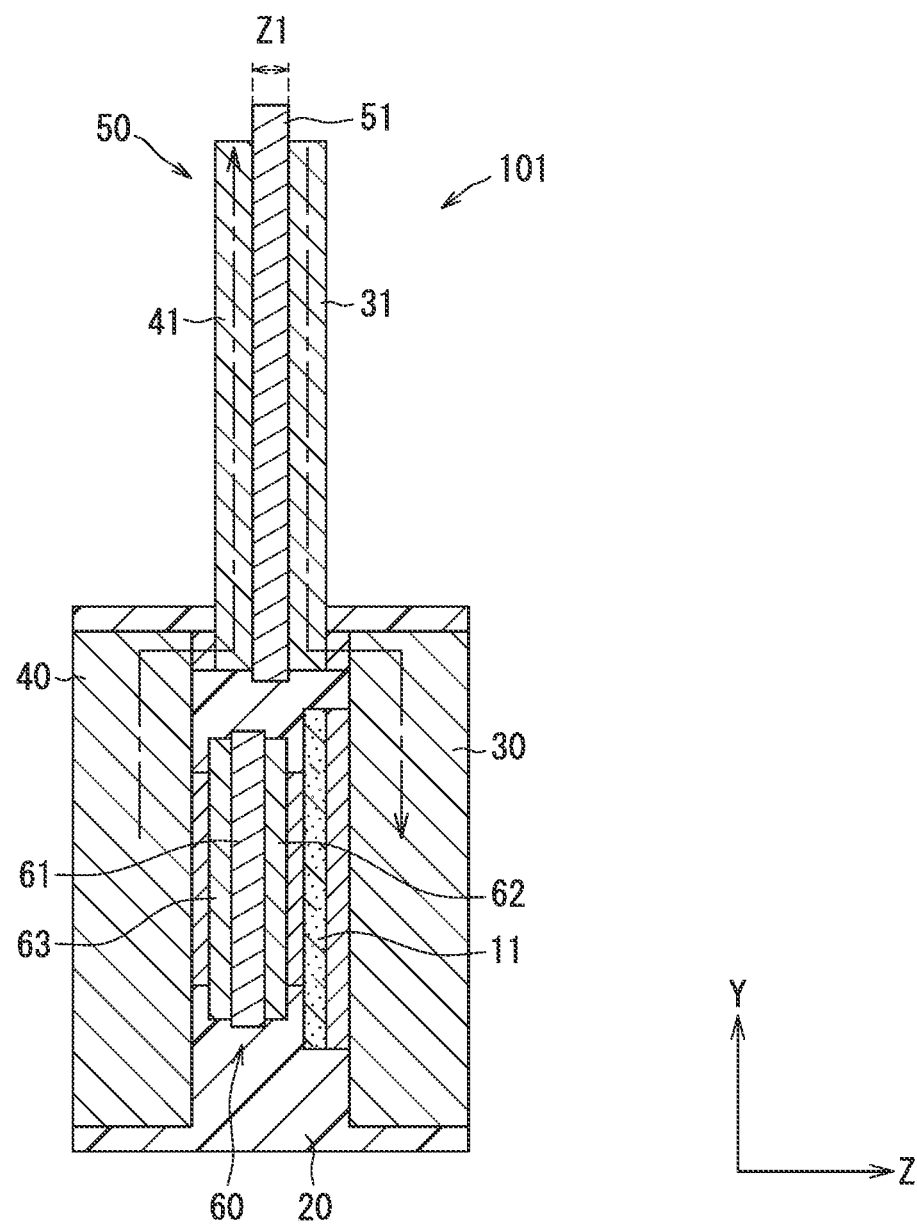
FIG. 2 is a cross-sectional view taken along a line II-II in FIG. 1.
Figure 3:
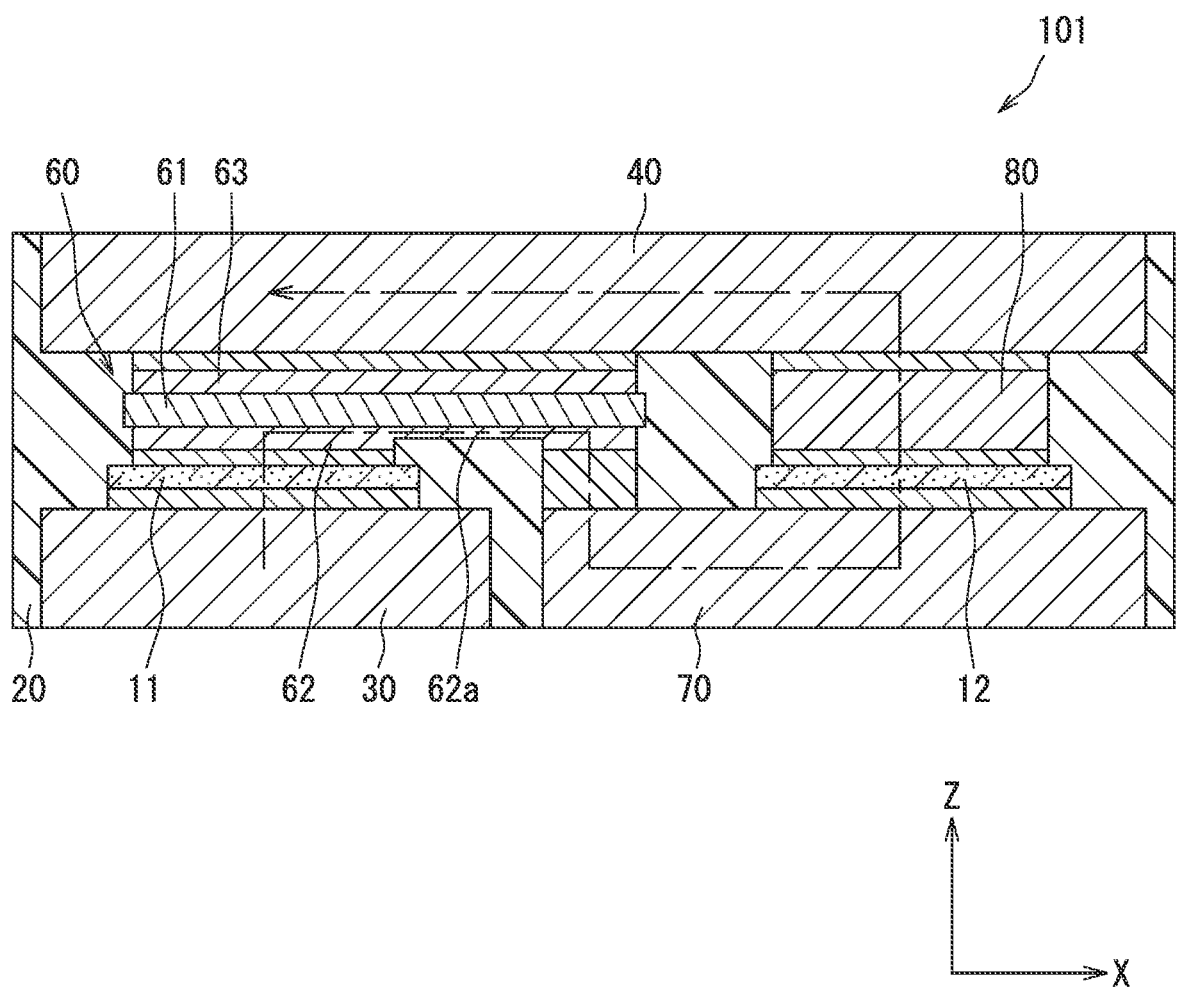
FIG. 3 is a cross-sectional view taken along a line III-III in FIG. 1.

Referring to FIGS. 1, 2, and 3, a semiconductor device 101 of a first embodiment will be described. The semiconductor device 101 includes a first semiconductor element 11, a second semiconductor element 12, a positive electrode metal plate 30, a positive electrode terminal 31, a negative electrode metal plate 40, a negative electrode terminal 41, an output metal plate 70, an output terminal 71, and the like. The semiconductor device 101 has a 2-in-1 package structure. The semiconductor device 101 can be applied to, for example, a power conversion device such as an inverter or a converter.

In the present embodiment, the negative electrode metal plate 40 corresponds to a first metal plate, the positive electrode metal plate 30 corresponds to a second metal plate, and the output metal plate 70 corresponds to a third metal plate. Further, the positive electrode terminal 31 corresponds to a first terminal, and the negative electrode terminal 41 corresponds to a second terminal.

In the semiconductor device 101, the components described above are covered with a sealing resin body 20. More specifically, the sealing resin body 20 is provided by an electrically insulating member, and covers the first and second semiconductor elements 11 and 12, the positive electrode metal plate 30, the negative electrode metal plate 40, and the output metal plate 70. That is, the sealing resin body 20 seals these components while being in contact with these components.

In the present embodiment, as an example, a semiconductor device 101 in which the first semiconductor element 11 is an upper arm semiconductor element and the second semiconductor element 12 is a lower arm semiconductor element is adopted. In the present embodiment, as an example of each of the first and second semiconductor elements 11 and 12, an RC-IGBT in which an IGBT (Insulated-Gate Bipolar Transistor) and a diode are integrated is adopted. Each of the first and second semiconductor elements 11 and 12 is an element having electrodes on both sides. Each of the first and second semiconductor elements 11 and 12 is a semiconductor switching element. In the present disclosure, alternatively, each of the first and second semiconductor elements 11 and 12 can be a MOSFET. As further another example, the semiconductor device 101 may have a configuration in which each of the upper arm and the lower arm has an IGBT and a diode, that is, in which four elements in total are included.

The first semiconductor element 11 and the second semiconductor element 12 are connected in series. The first semiconductor element 11 has a collector electrode electrically connected to the positive electrode terminal 31, and an emitter electrode electrically connected to a collector electrode of the second semiconductor element 12. The second semiconductor element 12 has the collector electrode electrically connected to the emitter electrode of the first semiconductor element 11, and the emitter electrode is electrically connected to the negative electrode terminal 41.

As shown in FIG. 1, each of the first semiconductor element 11 and the second semiconductor element 12 has a rectangular shape in the XY plane. The first semiconductor element 11 and the second semiconductor element 12 are arranged side by side in the X direction. As shown in FIGS. 2 and 3, each of the first semiconductor element 11 and the second semiconductor element 12 has a thickness in the Z direction. Therefore, it can be said that each of the first and second semiconductor element 11 and 12 has a rectangular parallelepiped shape. Each of the first and second semiconductor elements 11 and 12 has a collector electrode on one surface and an emitter electrode on the other surface opposite to the one surface.

The first semiconductor element 11 and the second semiconductor element 12 are arranged so that their collector electrodes face in the same direction. Therefore, the first semiconductor element 11 and the second semiconductor element 12 are arranged so that their emitter electrodes face in the same direction. That is, the first semiconductor element 11 and the second semiconductor element 12 are arranged so that the emitter electrodes thereof faces the negative electrode metal plate 40.

As shown in FIGS. 2 and 3, the first semiconductor element 11 is arranged between the negative electrode metal plate 40 and the positive electrode metal plate 30. In the first semiconductor element 11, the collector electrode is arranged so as to face the positive electrode metal plate 30. The collector electrode is electrically and mechanically connected to the positive electrode metal plate 30 via a conductive connecting member. In the present disclosure, a solder is used as an example of the conductive connecting member. However, the conductive connecting member is not limited to the solder, and silver paste or the like can also be used.

In the first semiconductor element 11, the emitter electrode is arranged so as to face a first metal body 62 of a second insulated wiring board 60. The emitter electrode of the first semiconductor element 11 is electrically and mechanically connected to the first metal body 62 via solder. The emitter electrode of the first semiconductor element 11 is electrically connected to the output metal plate 70 via solder and the first metal body 62. Further, the emitter electrode of the first semiconductor element 11 is electrically connected to the collector electrode of the second semiconductor element 12 via the first metal body 62, the solder, and the output metal plate 70. The emitter electrode of the first semiconductor element 11 is electrically insulated from the negative electrode metal plate 40 by a second insulated substrate 61 of the second insulated wiring board 60. The second insulated substrate 61 corresponds to an insulator.

The collector electrode of the first semiconductor element 11 corresponds to an electrode on the positive electrode metal plate side, and may also be referred to as a first electrode. The emitter electrode of the first semiconductor element 11 corresponds to an electrode on the negative electrode metal plate side, and may also be referred to as a second electrode. The second insulated wiring board 60 will be described in detail later.

The second semiconductor element 12 is arranged between the negative electrode metal plate 40 and the output metal plate 70. In the second semiconductor element 12, the collector electrode is arranged so as to face the output metal plate 70. The collector electrode of the second semiconductor element 12 is electrically and mechanically connected to the output metal plate 70 via solder. The emitter electrode of the second semiconductor element 12 is arranged so as to face the negative electrode metal plate 40. The emitter electrode of the second semiconductor element 12 is electrically and mechanically connected to the negative electrode metal plate 40 via solder and a terminal member 80. The collector electrode of the second semiconductor element 12 corresponds to an electrode on the output metal plate side, and may also be referred to as a first electrode. The emitter electrode of the second semiconductor element 12 corresponds to an electrode on the negative electrode metal plate side, and may also be referred to as a second electrode. The terminal member 80 is a block body made of a metal such as copper or aluminum.

The positive electrode metal plate 30 is made of a metal such as copper or aluminum. The positive electrode metal plate 30 is, for example, a rectangular parallelepiped block body. In the present embodiment, the positive electrode metal plate 30 is sufficiently thicker in the Z direction than the first and second semiconductor elements 11 and 12 and has a larger area in the XY plane than the first and second semiconductor elements 11 and 12. In the semiconductor device 101, therefore, the first semiconductor element 11 can be arranged to be located within the facing region of the positive electrode metal plate 30, that is, arranged in a region encompassed in the positive electrode metal plate 30 when viewed in the Z direction. Further, the positive electrode metal plate 30 is arranged to face the negative electrode metal plate 40 in the Z direction. It can be said that the positive electrode metal plate 30 is arranged to face the negative electrode metal plate 40 with the first semiconductor element 11 arranged between the positive electrode metal plate 30 and the negative electrode metal plate 40.

As shown in FIG. 2, the positive electrode metal plate 30 is electrically and mechanically connected to the positive electrode terminal 31 via solder. Therefore, the positive electrode metal plate 30 has the same potential as the positive electrode terminal 31. Further, the positive electrode metal plate 30 has a function as a part of the current path.

The positive electrode metal plate 30 is connected to the collector electrode of the first semiconductor element 11 via the solder. Therefore, it can also be said that the positive electrode metal plate 30 is thermally connected to the first semiconductor element 11. Therefore, heat generated from the first semiconductor element 11 is transferred to the positive electrode metal plate 30 via the solder. A surface of the positive electrode metal plate 30 opposite to the surface facing the first semiconductor element 11 is exposed from the sealing resin body 20. Therefore, the positive electrode metal plate 30 can dissipate the heat transferred from the first semiconductor element 11 from the exposed surface exposed from the sealing resin body 20. As described above, the positive electrode metal plate 30 has a function as a heat sink. The exposed surface of the positive electrode metal plate 30 is coplanar with the surface of the sealing resin body 20 on a periphery of the positive electrode metal plate 30, or protrudes from the surface of the sealing resin body 20. The exposed surface can also be said to be a heat dissipation surface.

The output metal plate 70 is made of the same material as the positive electrode metal plate 30. The output metal plate 70 has the same thickness as the positive electrode metal plate 30. As shown in FIG. 1, the output metal plate 70 is formed as an integral body with the output terminal 71. The output metal plate 70 is, for example, a rectangular parallelepiped block body. The output terminal 71 is a portion protruding from a part of the output metal plate 70. Therefore, the output metal plate 70 has the same potential as the output terminal 71. Further, the output metal plate 70 has a function as a part of the current path. The output terminal 71 and the output metal plate 70 may be provided by separate metal bodies, and may be connected to each other by solder or the like to thereby form an integral body.

In the present embodiment, the output metal plate 70 has an area in the XY plane wider than that of the positive electrode metal plate 30. More specifically, the length of the output metal plate 70 in the Y direction is same as the length of the positive electrode metal plate 30 in the Y direction, but the length of the output metal plate 70 in the X direction is greater than the length of the positive electrode metal plate 30 in the X direction. Therefore, the second semiconductor element 12 is arranged so as to be located within the facing region of the output metal plate 70. Further, the surface of the output metal plate 70 facing the second semiconductor element 12 can include a region for connecting with the first metal body 62.

Similarly to the positive electrode metal plate 30, the output metal plate 70 is arranged so as to face the negative electrode metal plate 40 in the Z direction. The output metal plate 70 is arranged to face the negative electrode metal plate 40 in a state where the second semiconductor element 12 is arranged between the output metal plate 70 and the negative electrode metal plate 40. Further, the output metal plate 70 is arranged side by side with the positive electrode metal plate 30 in the X direction. The output metal plate 70 and the positive electrode metal plate 30 are arranged next to each other via the sealing resin body 20. Therefore, the output metal plate 70 and the positive electrode metal plate 30 are electrically insulated by the sealing resin body 20.

The output metal plate 70 is connected to the collector electrode of the second semiconductor element 12 via solder. Therefore, it can be said that the output metal plate 70 is thermally connected to the second semiconductor element 12. Therefore, the heat generated from the second semiconductor element 12 is transferred to the output metal plate 70 via the solder. The surface of the output metal plate 70 opposite to the second semiconductor element 12 is exposed from the sealing resin body 20. Therefore, the output metal plate 70 can dissipate the heat transferred from the second semiconductor element 12 from the exposed surface exposed from the sealing resin body 20. As described above, the output metal plate 70 has a function as a heat sink. The exposed surface of the output metal plate 70 is coplanar with the surface of the sealing resin body 20 on a periphery of the output metal plate 70 or protrudes from the surface of the sealing resin body 20.

The negative electrode metal plate 40 is made of the same material as the positive electrode metal plate 30. The negative electrode metal plate 40 has the same shape and thickness as the positive electrode metal plate 30. However, the negative electrode metal plate 40 has a larger area in the XY plane than the positive electrode metal plate 30 and the output metal plate 70. More specifically, the length of the negative electrode metal plate 40 in the Y direction is the same length as the positive electrode metal plate 30 and the output metal plate 70 in the Y direction, but the length of the negative electrode metal plate 40 in the X direction is greater than the lengths of the positive electrode metal plate 30 and the output metal plate 70 in the X direction. Further, the length of the negative electrode metal plate 40 in the X direction is longer than the total length of the length of the positive electrode metal plate 30 in the X direction and the length of the output metal plate 70 in the X direction.

In the semiconductor device 101, therefore, both the first semiconductor element 11 and the second semiconductor element 12 are arranged to be located within the facing region of the negative electrode metal plate 40. Further, both the positive electrode metal plate 30 and the output metal plate 70 are arranged to be located in the facing region of the negative electrode metal plate 40. As described above, the negative electrode metal plate 40 is arranged to face both the first semiconductor element 11 and the second semiconductor element 12.

As shown in FIG. 2, the negative electrode metal plate 40 is electrically and mechanically connected to the negative electrode terminal 41 via solder. Therefore, the negative electrode metal plate 40 has the same potential as the negative electrode terminal 41. Further, the negative electrode metal plate 40 has a function as a part of the current path.

The negative electrode metal plate 40 is connected to the emitter electrode of the second semiconductor element 12 via solder. Therefore, it can be said that the negative electrode metal plate 40 is thermally connected to the second semiconductor element 12. Further, the negative electrode metal plate 40 is connected to the second metal body 63 of the second insulated wiring board 60 via solder. In the second insulated wiring board 60, the first metal body 62 is connected to the emitter electrode of the first semiconductor element 11. As will be described later, the first metal body 62 and the second metal body 63 are metal bodies formed on the front and back surfaces of the second insulated substrate 61. The heat generated from the first semiconductor element 11 is transferred to the negative electrode metal plate 40 via the second insulated wiring board 60. For this reason, it can be said that the negative electrode metal plate 40 is thermally connected to the emitter electrode of the first semiconductor element 11 by the second insulated substrate 61 in a state of being electrically insulated from the first semiconductor element 11 by the second insulated substrate 61. Therefore, the heat generated from the first semiconductor element 11 and the heat generated from the second semiconductor element 12 are transferred to the negative electrode metal plate 40.

The surface of the negative electrode metal plate 40 opposite to the second semiconductor element 12 is exposed from the sealing resin body 20. Therefore, the negative electrode metal plate 40 can dissipate the heat transferred from both the first and second semiconductor elements 11 and 12 from the exposed surface exposed from the sealing resin body 20. As described above, the negative electrode metal plate 40 has a function as a heat sink.

The positive electrode terminal 31 and the negative electrode terminal 41 are terminals for electrically connecting the semiconductor device 101 with a device or circuit provided outside the semiconductor device 101. That is, the positive electrode terminal 31 and the negative electrode terminal 41 are terminals for external connection.

The positive electrode terminal 31 and the negative electrode terminal 41 are arranged so as to face each other. As shown in FIGS. 1 and 2, the positive electrode terminal 31 is arranged at a position biased toward the first semiconductor element 11 with respect to the second semiconductor element 12. It can be said that the positive electrode terminal 31 is arranged adjacent to the first semiconductor element 11 in the Y direction. In other words, the positive electrode terminal 31 is arranged side by side with the first semiconductor element 11 in the Y direction included in the XY plane. The negative electrode terminal 41 is a terminal that allows a current to flow between the negative electrode terminal 41 and the positive electrode terminal 31. The negative electrode terminal 41 is arranged so as to face the positive electrode terminal 31. Therefore, the negative electrode terminal 41 is arranged on the Y direction side of the first semiconductor element 11 in the XY plane.

In order to electrically insulate the positive electrode terminal 31 and the negative electrode terminal 41 from each other, the positive electrode terminal 31 and the negative electrode terminal 41 are arranged so as to face each other with the first insulated substrate 51, which is an electrically insulating member, arranged therebetween. In the present embodiment, as an example, the positive electrode terminal 31 and the negative electrode terminal 41 are provided by metal bodies formed on the front and back surfaces of the first insulated substrate 51. That is, the positive electrode terminal 31 and the negative electrode terminal 41 are metal bodies formed on the front and back surfaces of the first insulated substrate 51 of a first insulated wiring board 50. The first insulated substrate 51 corresponds to an insulated plate.

The first insulated wiring board 50 is a substrate in which the positive electrode terminal 31 and the negative electrode terminal 41, which are each made of a metal body such as copper, are formed and integrated on the front and back surfaces of the first insulated substrate 51 made of ceramics such as silicon nitride. That is, in the first insulated wiring board 50, the metal body formed on one surface of the first insulated substrate 51 includes the positive electrode terminal 31, and the metal body formed on the other surface of the first insulated substrate 51 includes the negative electrode terminal 41. Each of the positive electrode terminal 31 and the negative electrode terminal 41 are formed, for example, by patterning a metal body formed on the first insulated substrate 51.

An end of the first insulated wiring board 50 is arranged in a facing region in which the positive electrode metal plate 30 and the negative electrode metal plate 40 face each other, and the other part is arranged outside the facing region. Since the first insulated wiring board 50 uses ceramics as the first insulated substrate 51, the first insulated wiring board 50 has good thermal conductivity.

In the semiconductor device 101, by employing the first insulated wiring board 50, the positive electrode terminal 31, the first insulated substrate 51, and the negative electrode terminal 41 can be provided by a single component. Further, in the semiconductor device 101, it is possible to arrange the positive electrode terminal 31 and the negative electrode terminal 41 to face each other (to be arranged in parallel) while ensuring the electrical insulation between the positive electrode terminal 31 and the negative electrode terminal 41 by the first insulated substrate 51.

A part of the first insulated wiring board 50 is covered with the sealing resin body 20, and the other part is exposed from the sealing resin body 20. In the first insulated wiring board 50, at least a part of the positive electrode terminal 31 and at least a part of the negative electrode terminal 41 are exposed from the sealing resin body 20. In the present disclosure, the positive electrode terminal 31 and the negative electrode terminal 41 may not be arranged so as to face each other. Further, in the present disclosure, the positive electrode terminal 31 may not be arranged at a position biased toward the first semiconductor element 11 with respect to the second semiconductor element 12.

The second insulated wiring board 60 is a substrate in which the first metal body 62 and the second metal body 63, which are metal bodies made of copper, are formed and integrated on the front and back surfaces of the second insulated substrate 61 made of ceramics such as silicon nitride. In the second insulated wiring board 60, the metal body formed on one surface of the second insulated substrate 61 includes the first metal body 62, and the metal body formed on the other surface of the second insulated substrate 61 includes the second metal body 63. The first metal body 62 and the second metal body 63 are electrically insulated from each other by the second insulated substrate 61. Each of the first metal body 62 and the second metal body 63 is formed, for example, by patterning a metal body formed on the second insulated substrate 61.

The second insulated wiring board 60 is arranged at a position facing the first semiconductor element 11 and a position facing the end of the output metal plate 70. That is, the second insulated wiring board 60 is provided to extend from a position above the first semiconductor element 11 to a position above the end of the output metal plate 70. Further, the first metal body 62 is arranged at a position facing the first semiconductor element 11 and a position facing the end portion of the output metal plate 70. The emitter electrode of the first semiconductor element 11 and the output metal plate 70 are electrically connected to the first metal body 62. On the other hand, the second metal body 63 is electrically connected to the negative electrode metal plate 40.

As described above, since the second insulated wiring board 60 has the second insulated substrate 61 made of ceramics, the second insulated wiring board 60 has good thermal conductivity. Therefore, the heat generated from the first semiconductor element 11 is easily transferred to the negative electrode metal plate 40 via the solder and the second insulated wiring board 60. Therefore, it can be said that the emitter electrode of the first semiconductor element 11 is thermally connected to the negative electrode metal plate 40 in a state of being electrically insulated from the negative electrode metal plate 40 by the second insulated substrate 61. However, the heat generated by the first semiconductor element 11 is transferred to the negative electrode metal plate 40 even if ceramics are not used as the second insulated substrate 61.

The first metal body 62 corresponds to a connecting portion that electrically connects the emitter electrode of the first semiconductor element 11 and the output metal plate 70. As shown in FIG. 3, the first metal body 62 has a recess 62a at a position between the facing region facing the emitter electrode and the facing region facing the output metal plate 70. The recess 62a is recessed from the facing region facing the emitter electrode and the facing region facing the output metal plate 70. That is, the thickness of the first metal body 62 is smaller at the recess 62a than the peripheral part. The recess 62a is provided in an area at least corresponding to the end of the first semiconductor element 11, and extends over an entire length of the end of the first semiconductor element 11 in the Y direction. As a result, the first metal body 62 can easily secure an insulation distance from the collector electrode of the first semiconductor element 11 and the positive electrode metal plate 30.

Referring to FIGS. 2 and 3, an operation of the semiconductor device 101 will be described. In FIGS. 2 and 3, broken line arrows indicate a schematic current flow (current path) between the positive electrode terminal and the negative electrode terminal. It is to be noted that, since the direction of the current depends on the operating state of an inverter, it is not always the direction from the positive electrode to the negative electrode.

In the semiconductor device 101, a current flows from the positive electrode terminal 31 to the negative electrode terminal 41. More specifically, the semiconductor device 101 has a current path in which the current flows in order of the positive electrode terminal 31, the positive electrode metal plate 30, the first semiconductor element 11, the first metal body 62, the output metal plate 70, the second semiconductor element 12, the terminal member 80, the negative electrode metal plate 40, and the negative electrode 41. It can be said that the semiconductor device 101 has an N-shaped connection structure. Further, in the semiconductor device 101, the current also flows through the solders that electrically connects the respective components. However, it is omitted here for the sake of brevity.

In the semiconductor device 101, as shown in FIG. 2, the current path from the positive electrode terminal 31 to the positive electrode metal plate 30 faces the current path from the negative electrode metal plate 40 to the negative electrode terminal 41, and the flow directions of the currents thereof are opposite to each other. Further, as shown in FIG. 3, the current path from the positive electrode metal plate 30 to the output metal plate 70 faces the current path in the negative electrode metal plate 40, and the flow directions of the currents thereof are opposite to each other. More specifically, in the semiconductor device 101, the current path from the positive electrode metal plate 30 to the output metal plate 70 via the first metal body 62 faces the current path from the negative electrode metal plate 40 to the second metal body 63, and the flow directions of the currents thereof are opposite to each other.

Therefore, in the current path from the positive electrode terminal 31 to the negative electrode terminal 41, a section in which the current paths are arranged to face each other and the flow directions of which are opposite to each other can be increased, and thus the inductance of the wiring can be reduced. Further, since the inductance can be reduced without using an intermediate electrode, it is possible to suppress the increase in body size. Further, it can be said that the semiconductor device 101 can reduce the current loop and improve the electrical characteristics.

The first embodiment of the present disclosure has been described hereinabove. However, the present disclosure is not limited to the embodiment described hereinabove, and various modifications are possible within a scope that does not depart from the gist of the present disclosure. Second to fifth embodiments and first to seventh modifications will be described as other embodiments of the present disclosure. Each of the first to fifth embodiments and first to seventh modifications may be independently implemented, or may be combined appropriately. The present disclosure can be implemented by various combinations of the first to fifth embodiments and first to seventh modifications without being limited to the combination described in the embodiments.

Second Embodiment

Figure 4:
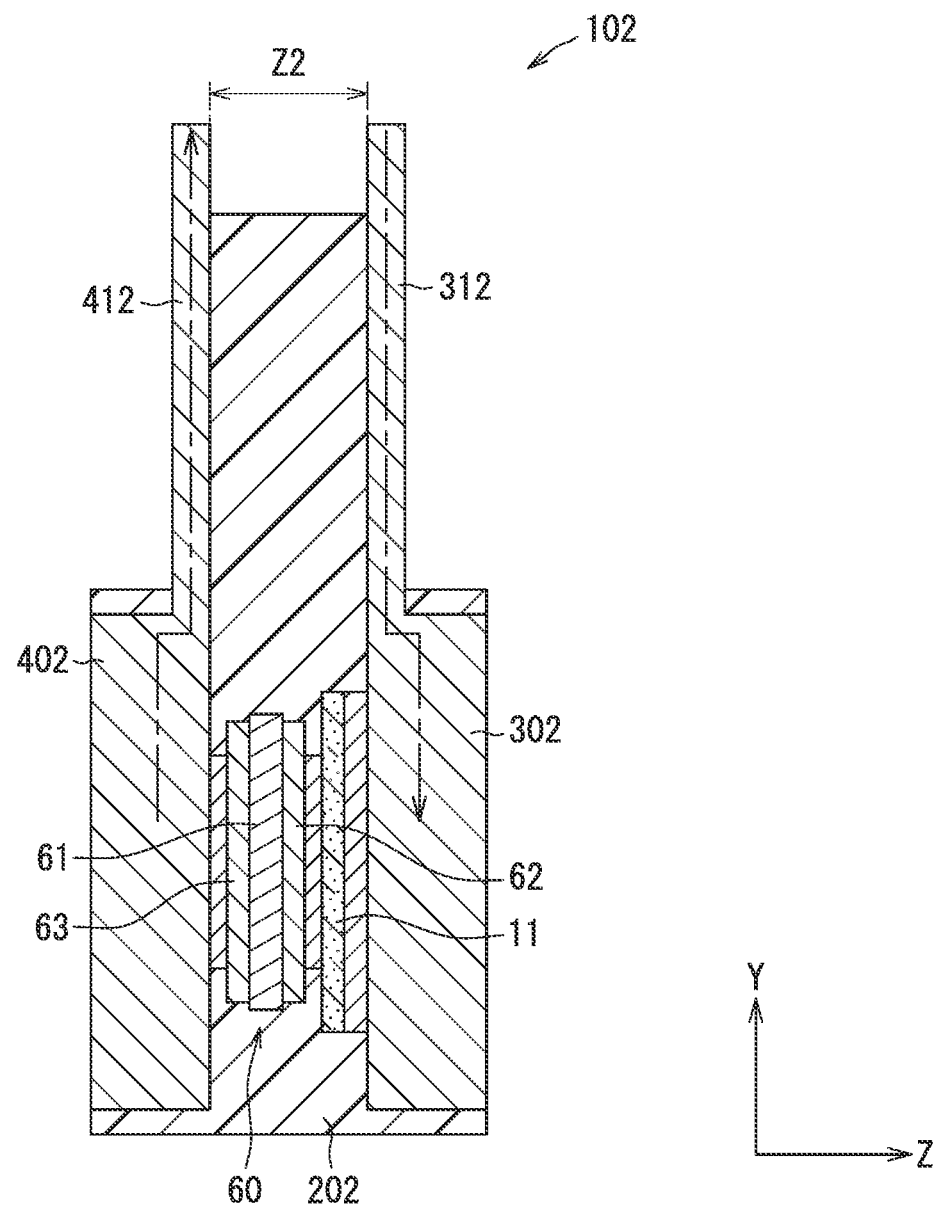
FIG. 4 is a cross-sectional view showing a schematic configuration of a semiconductor device according to a second embodiment.

A semiconductor device 102 according to a second embodiment will be described with reference to FIG. 4. The semiconductor device 102 is different from the semiconductor device 101 mainly on the point in which the first insulated wiring board 50 is not used. Similar to the semiconductor device 101, the semiconductor device 102 has an N-shaped connection structure. FIG. 4 is a cross-sectional view corresponding to FIG. 2.

The semiconductor device 102 includes a metal member in which a positive electrode metal plate 302 and a positive electrode terminal 312 are integrally formed, and a metal member in which a negative electrode metal plate 402 and a negative electrode terminal 412 are integrally formed. The positive electrode terminal 312 and the negative electrode terminal 412 are arranged so as to face each other, and are electrically insulated from each other by the sealing resin body 202.

The semiconductor device 102 can achieve the similar effects to those of the semiconductor device 101 of the first embodiment. Further, in the semiconductor device 102, the positive electrode terminal 312 and the negative electrode terminal 412 are electrically insulated from each other by the sealing resin body 202. Therefore, the semiconductor device 102 can have a longer insulation distance between the positive electrode terminal 312 and the negative electrode terminal 412 than that in the semiconductor device 101. Further, the semiconductor device 102 does not require the first insulated wiring board 50, and thus has an advantage that the costs can be reduced as compared with the semiconductor device 101.

Third Embodiment

Figure 5:
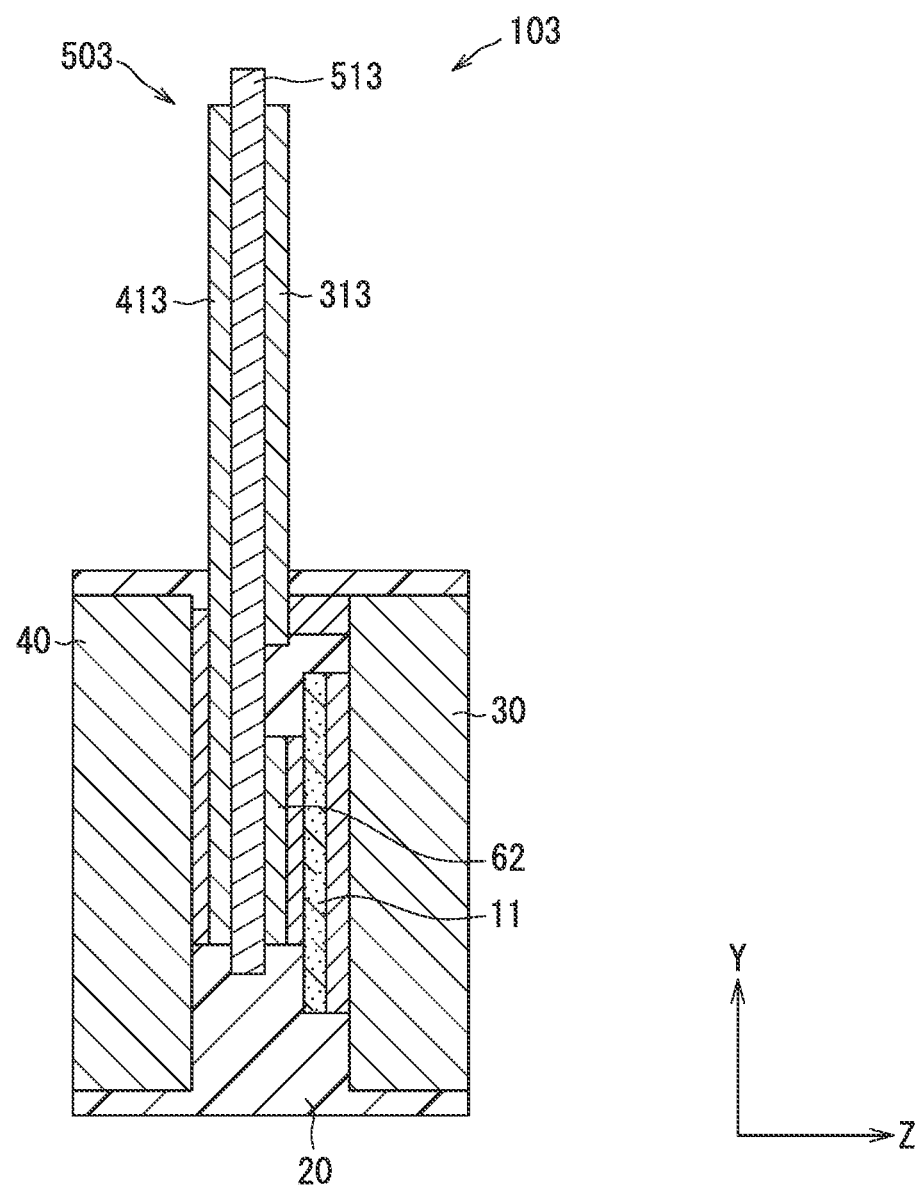
FIG. 5 is a cross-sectional view showing a schematic configuration of a semiconductor device according to a third embodiment.

A semiconductor device 103 according to a third embodiment will be described with reference to FIG. 5. The semiconductor device 103 is different from the semiconductor device 101 mainly on the point in which an insulated wiring board 503 is used. Similar to the semiconductor device 101, the semiconductor device 103 has an N-shaped connection structure. FIG. 5 is a cross-sectional view corresponding to FIG. 2.

In the insulated wiring board 503, a metal body formed on one surface of an insulated substrate 513 includes the first metal body 62 and a positive electrode terminal 313, and a metal body formed on the other surface of the insulated substrate 513 includes a negative electrode terminal 413. The negative electrode terminal 413 can be regarded as one in which the second metal body 63 of the first embodiment and the negative electrode terminal 41 are integrated. The insulated wiring board 503 can be made of the same material as the first insulated wiring board 50 and the second insulated wiring board 60, and can be manufactured by the same method. As described above, the insulated wiring board 503 corresponds to the one in which the first insulated wiring board 50 and the second insulated wiring board 60 are integrally formed. The insulated substrate 513 corresponds to the insulator.

The semiconductor device 103 can achieve the similar effects to those of the semiconductor device 101. Further, since the semiconductor device 103 has the insulated wiring board 503, the insulated substrate 513, the first metal body 62, the positive electrode terminal 313, and the negative electrode terminal 413 can be regarded as the integral body. Further, the semiconductor device 103 does not need two insulated wiring boards, such as the first insulated wiring board 50 and the second insulated wiring board 60.

Fourth Embodiment

A semiconductor device 104 according to a fourth embodiment will be described with reference to FIGS. 6 to 9. The semiconductor device 104 is different from the semiconductor device 101 o the point that an insulated wiring board 504 is used. Similar to the semiconductor device 101, the semiconductor device 104 has an N-shaped connection structure. In the present embodiment, the sealing resin body 20 is not shown in order to prevent the drawings from becoming complicated.

Figure 6:
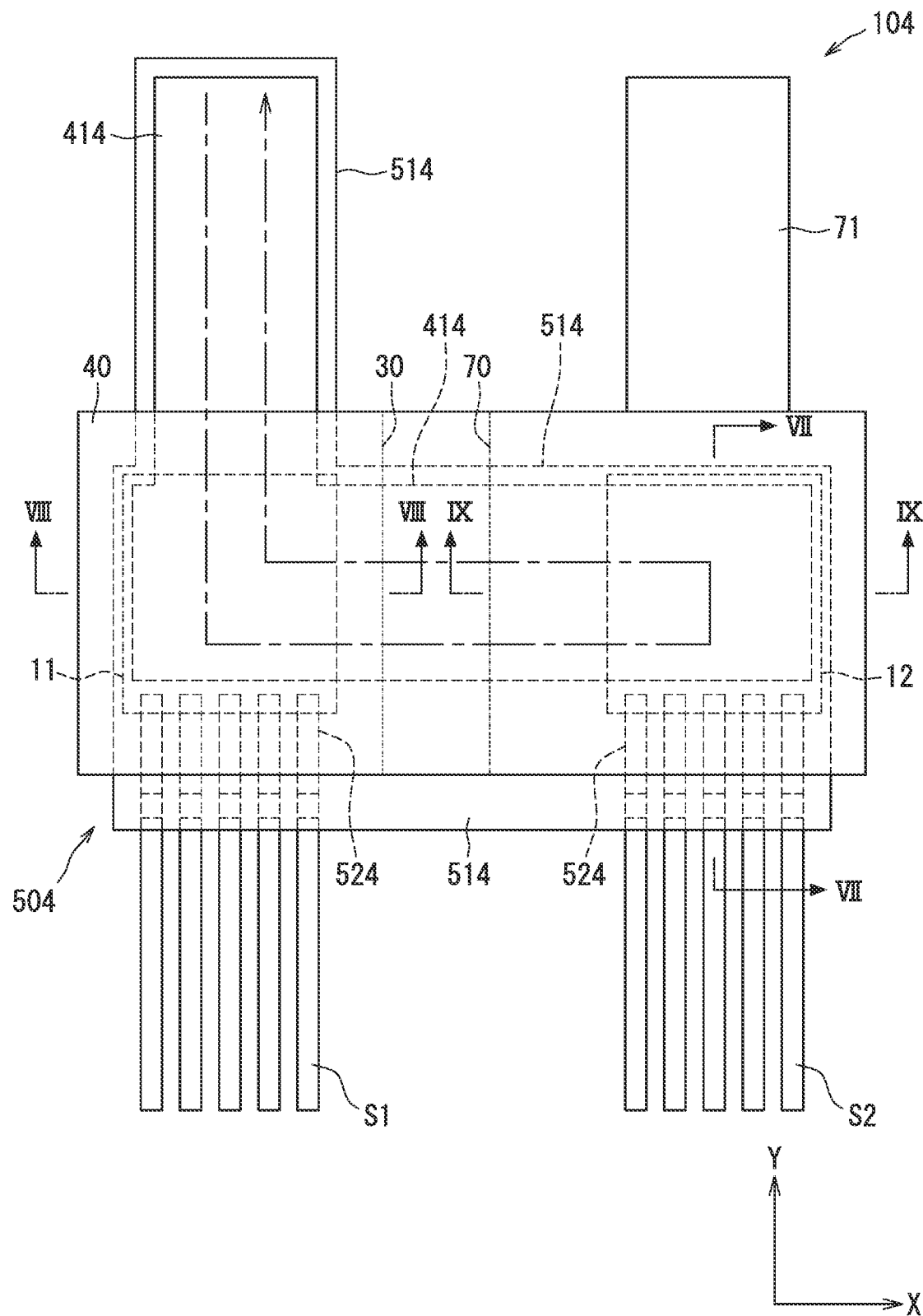
FIG. 6 is a plan view showing a schematic configuration of a semiconductor device according to a fourth embodiment.

As shown in FIG. 6, the semiconductor device 104 includes an insulated wiring board 504, a first signal terminal 51, and a second signal terminal S2. The insulated wiring board 504 includes a metal body formed on one surface of the insulated substrate 514 and a metal body formed on the other surface of the insulated substrate 514. The insulated wiring board 504 can be made of the same material as the first insulated wiring board 50 and the second insulated wiring board 60, and can be manufactured by the same method.

As shown in FIGS. 6, 7, 8 and 9, the metal body formed on one surface of the insulated substrate 514 includes a signal metal body 524 in addition to the first metal body 62 and the positive electrode terminal. The positive electrode terminal of the semiconductor device 104 has the same configuration as the positive electrode terminal 313 of the semiconductor device 103.

Figure 7:
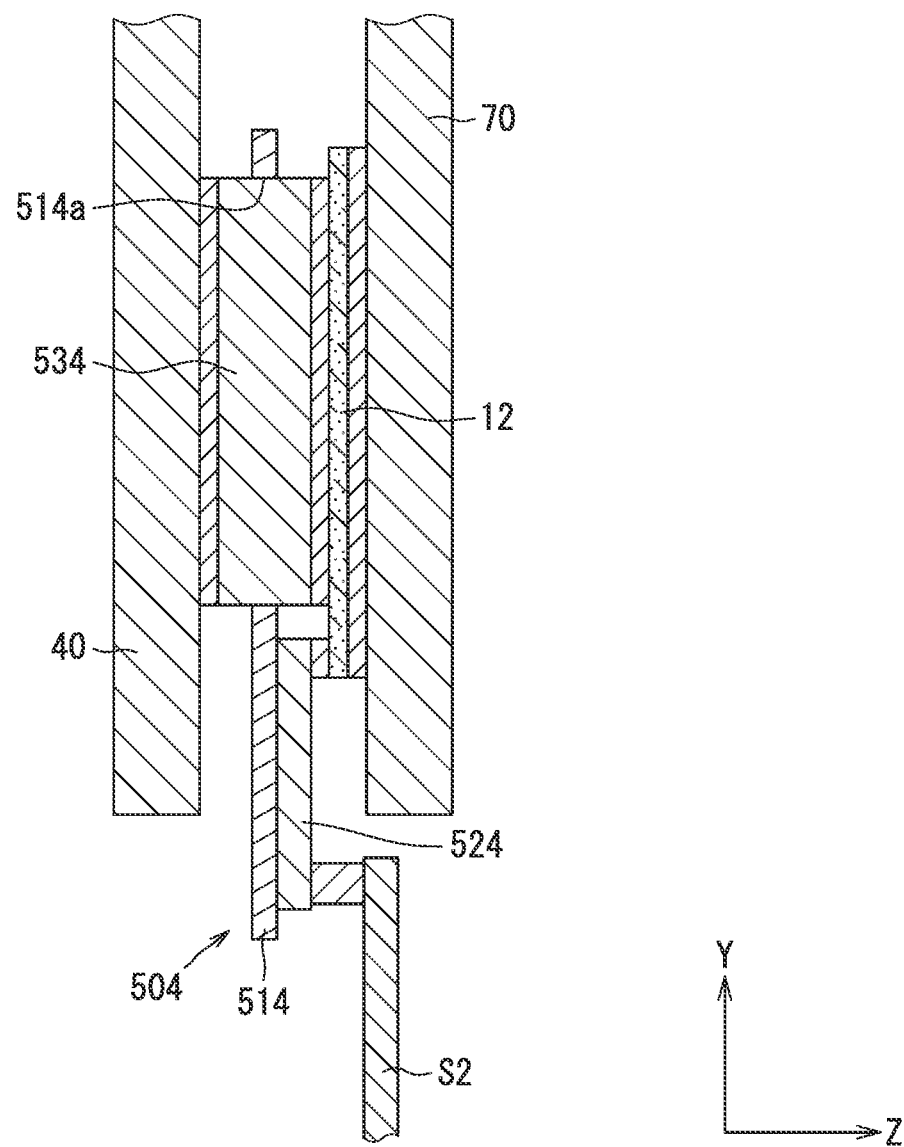
FIG. 7 is a cross-sectional view taken along a line VII-VII in FIG. 6.

The insulated substrate 514 is provided with a plurality of the signal metal bodies 524. As shown in FIG. 7, the signal metal bodies 524 are electrically connected to, for example, gate electrodes of the semiconductor elements 11 and 12, and are also electrically connected to signal terminals S2 (S1).

The semiconductor device 104 may include a temperature-sensitive diode for detecting the temperature of the first and second semiconductor elements 11 and 12. In this case, the signal terminals S1 and S2 may include those electrically connected to the temperature sensitive diode.

More specifically, the insulated substrate 514 has a plurality of signal metal bodies 524 that are arranged side by side in the Y direction. The insulated substrate 514 has a plurality of signal metal bodies 524 disposed on an opposite side to the positive electrode terminal with respect to the first semiconductor element 11 in the Y direction. The insulated substrate 514 further has a plurality of signal metal bodies 524 disposed on an opposite side to the output terminal 71 with respect to the second semiconductor element 12 in the Y direction. That is, on one surface of the insulated substrate 514, the signal metal bodies 524, the first metal body 62, and the positive electrode terminal 313 are aligned in this order in the Y direction, as well as the signal metal bodies 524 and a connection metal body 534 are aligned in this order in the Y direction.

Figure 8:
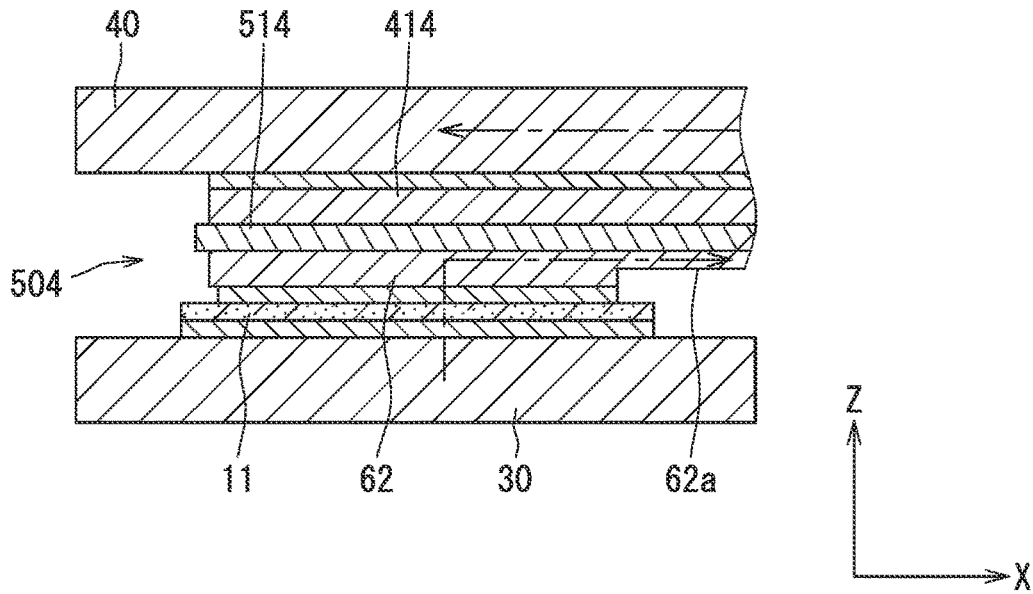
FIG. 8 is a cross-sectional view taken along a line VIII-VIII in FIG. 6.
Figure 9:
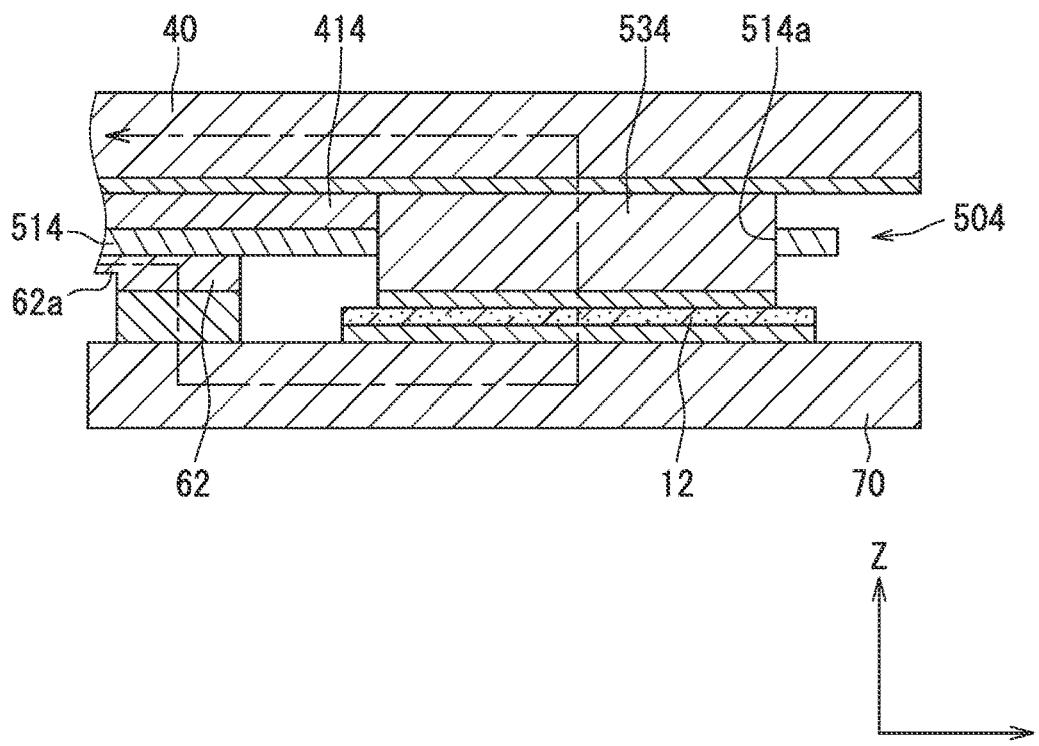
FIG. 9 is a cross-sectional view taken along a line IX-IX in FIG. 6.

On the other hand, the metal body formed on the other surface of the insulated substrate 514 includes a negative electrode terminal 414, as shown in FIGS. 8 and 9. Likewise the negative electrode terminal 413, the negative electrode terminal 414 is arranged to face the positive electrode terminal. The negative electrode terminal 414 and the positive electrode terminal 313 are electrically insulated by the insulated substrate 514. The metal body as the negative electrode terminal 414 includes a portion projected from the sealing resin body 20 and a portion that extends from the facing region facing the first semiconductor element 11 to the facing region facing the second semiconductor element 12, the former portion and the latter portion being integral.

Further, as shown in FIG. 9, the negative electrode terminal 414 is provided integrally with the connecting metal body 534. The insulated substrate 514 is formed with a through hole 514a formed at a position facing the second semiconductor element 12. The connecting metal body 534 is disposed in the through hole 514a to extend from one surface side to the other surface side of the insulated substrate 514.

The negative electrode terminal 414 and the connecting metal body 534 are electrically and mechanically connected to the negative electrode metal plate 40 via solder. Further, the connecting metal body 534 is electrically and mechanically connected to the emitter electrode of the second semiconductor element 12 via solder. As a result, the emitter electrode of the second semiconductor element 12 is electrically connected to the negative electrode terminal 414.

The semiconductor device 104 can achieve the similar effects to those of the semiconductor device 101. Further, in the semiconductor device 104, since the insulated wiring board 504 can be arranged evenly on the left and right sides in the XY plane, it is easy to balance the stress. That is, the semiconductor device 104 can suppress a local generation of stress due to the difference in the coefficient of linear expansion between the components. More specifically, in the semiconductor device 104, it is possible to suppress an occurrence of stress in each of the first and second semiconductor elements 11 and 12 and in each of connection portions. Therefore, the semiconductor device 104 can improve the electrical reliability, as compared with the configuration in which the stress is locally generated.

Further, in the semiconductor device 104, the insulated wiring board 504 has the signal metal bodies 524, in addition to the first metal body 62 and the connection metal body 534. Therefore, in the semiconductor device 104, the insulated wiring board 504 can be connected to the first signal terminal S1 and the second signal terminal S2 at the same time as connecting the insulated wiring board 504 to the first and second semiconductor elements 11 and 12.

Fifth Embodiment

A semiconductor device 105 according to a fifth embodiment will be described with reference to FIGS. 10 to 12. The semiconductor device 105 is different from the semiconductor device 101 mainly on the point of the arrangement of the first and second semiconductor elements 11 and 12. Differently from the semiconductor device 101, the semiconductor device 105 has a U-shaped connection structure. In the present embodiment, the sealing resin body 20 is not shown in order to prevent the drawings from becoming complicated.

The semiconductor device 105 includes a first semiconductor element 11 as an upper arm semiconductor element and a second semiconductor element 12 as a lower arm semiconductor element connected in series with the first semiconductor element 11. In the semiconductor device 105, the first semiconductor element 11 and the second semiconductor element 12 are arranged in opposite directions.

That is, the first and second semiconductor elements 11 and 12 are arranged so that the emitter electrode of the first semiconductor element 11 and the collector electrode of the second semiconductor element 12 face in the same direction. Therefore, the first and second semiconductor elements 11 and 12 are arranged so that the collector electrode of the first semiconductor element 11 and the emitter electrode of the second semiconductor element 12 face in the same direction.

Figure 12:
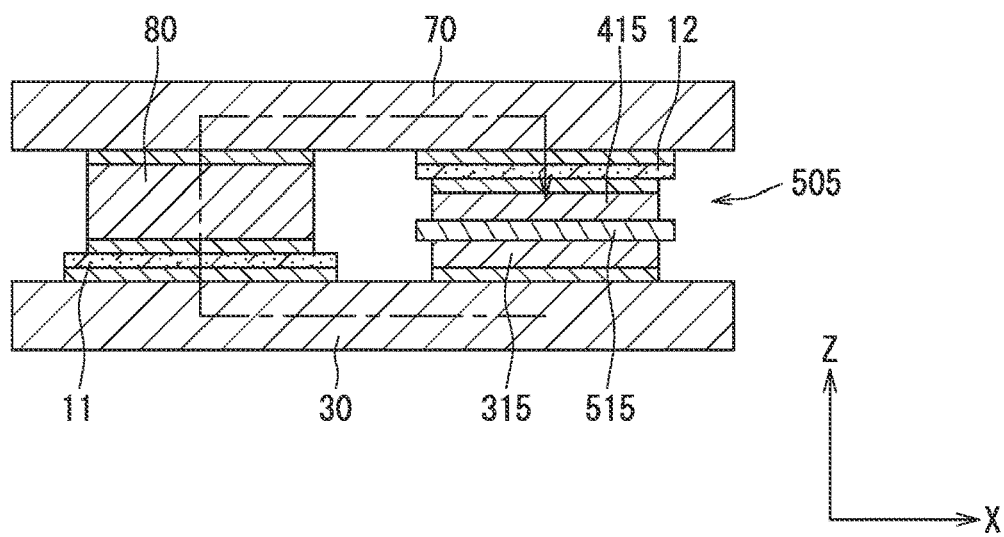
FIG. 12 is a cross-sectional view taken along a line XII-XII in FIG. 10.

Therefore, as shown in FIG. 12, in the semiconductor device 105, the emitter electrode of the first semiconductor element 11 and the collector electrode of the second semiconductor element 12 are arranged to face the output metal plate 70. Further, the collector electrode of the first semiconductor element 11 and the emitter electrode of the second semiconductor element 12 are arranged to face the positive electrode metal plate 30.

Figure 11:
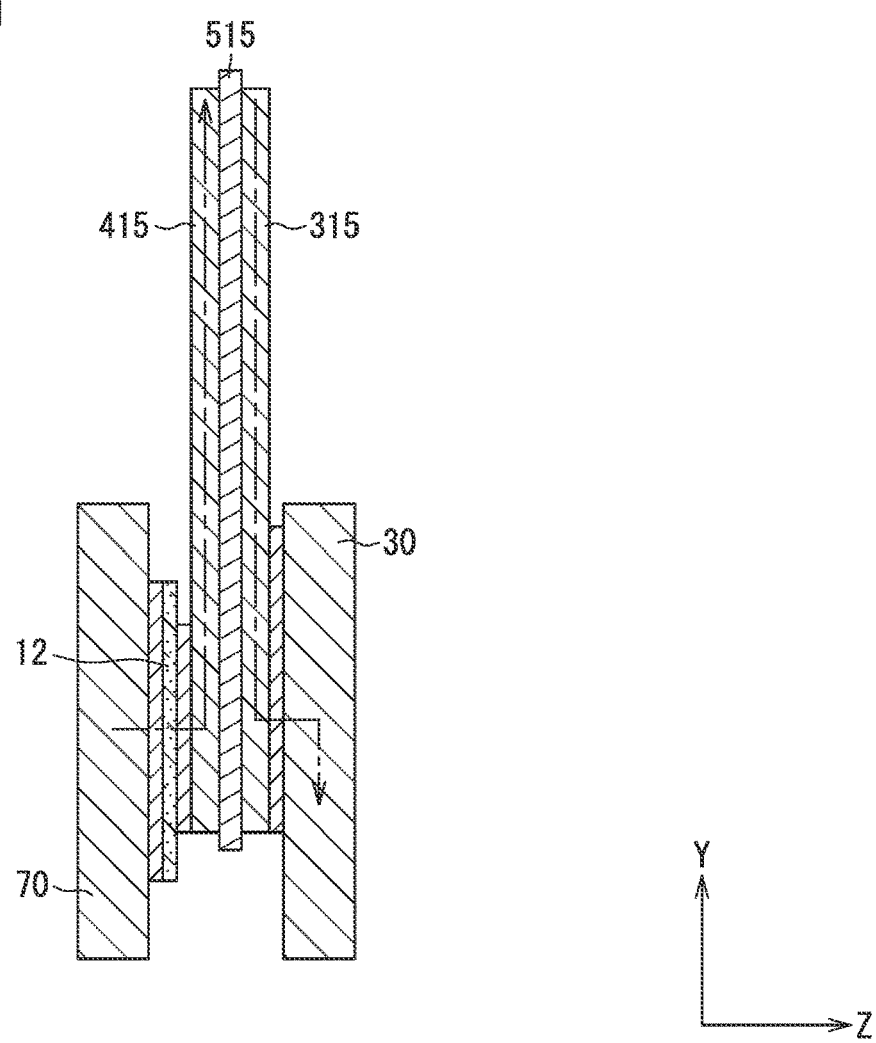
FIG. 11 is a cross-sectional view taken along a line XI-XI in FIG. 10.

As shown in FIG. 11, the semiconductor device 105 includes an insulated wiring board 505. Similarly to the first insulated wiring board 50, the insulated wiring board 505 is a substrate including an insulated substrate 515, which is made of ceramics such as silicon nitride, and metal bodies, which are made of a metal such as copper, formed on the front and back surfaces of an insulated substrate 515. The insulated wiring board 505 is provided to extend from the facing region of the second semiconductor element 12 to the outside of the sealing resin body 20. As a result, in the insulated wiring board 505, a positive electrode terminal 315 and a negative electrode terminal 415, which will be described later, can be used as external connection terminals.

In the insulated wiring board 505, the metal body formed on one surface of the insulated substrate 515 includes the positive electrode terminal 315, and the metal body formed on the other surface of the insulated substrate 515 includes the negative electrode terminal 415. As described above, in the semiconductor device 105, the positive electrode terminal 315 and the negative electrode terminal 415 are formed on the insulated wiring board 505, similarly to the semiconductor device 103. Therefore, the positive electrode terminal 315 and the negative electrode terminal 415 are arranged to face each other via the insulated substrate 515, and are electrically insulated by the insulated substrate 515.

Figure 10:
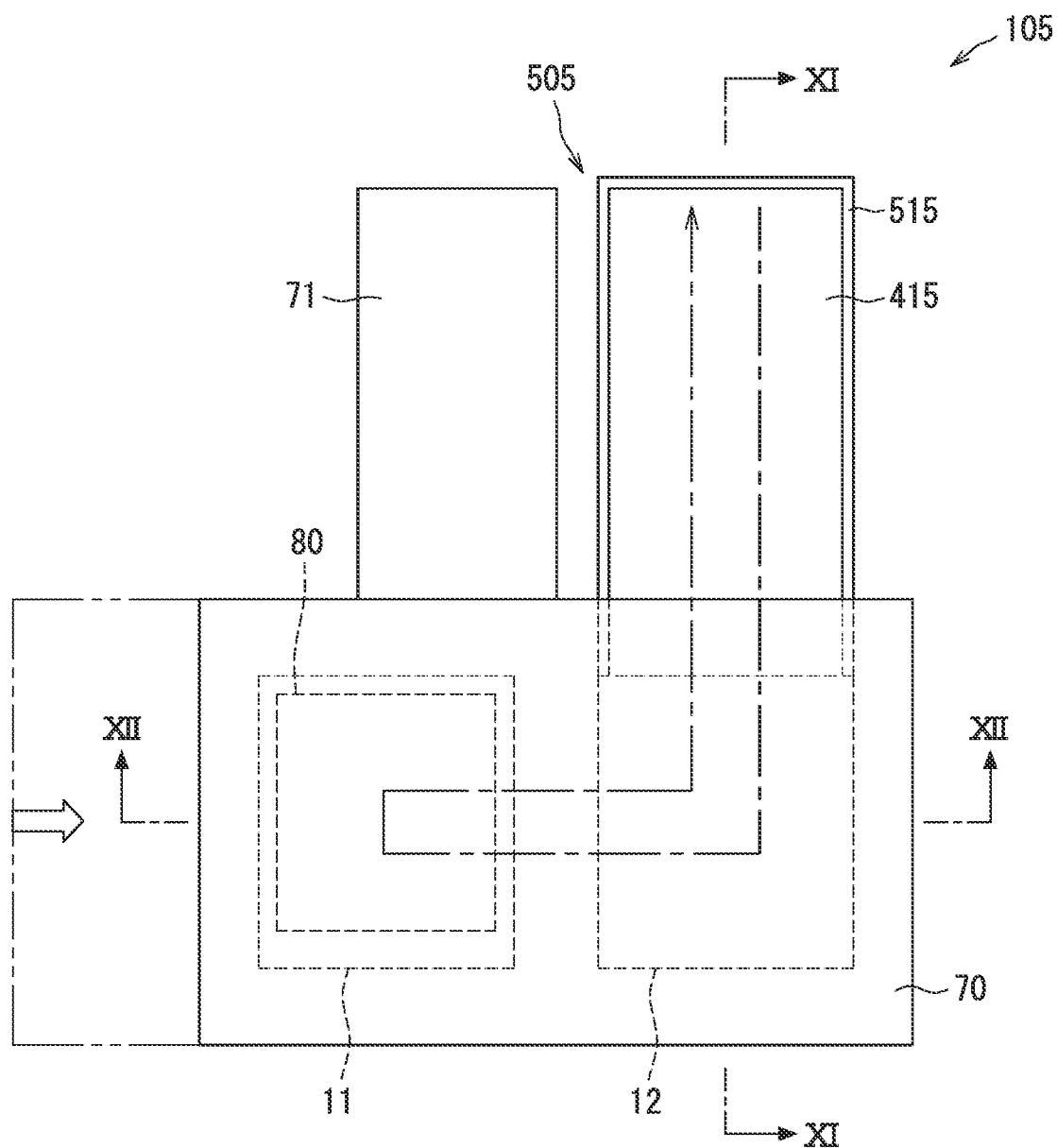
FIG. 10 is a plan view showing a schematic configuration of a semiconductor device according to a fifth embodiment.

Further, as shown in FIG. 10, the insulated wiring board 505 is arranged at a position biased toward the second semiconductor element 11 with respect to the first semiconductor element 12. Therefore, the positive electrode terminal 315 and the negative electrode terminal 415 are arranged at positions biased toward the second semiconductor element 12 with respect to the first semiconductor element 11. That is, the positive electrode terminal 315 and the negative electrode terminal 415 are aligned with the second semiconductor element 12 in the Y direction in the XY plane.

In the semiconductor device 105, as shown in FIGS. 11 and 12, the positive electrode metal plate 30 and the output metal plate 70 are arranged to face each other. The positive electrode metal plate 30 and the output metal plate 70 are made of the same material as those of the first embodiment, and have the same shape as those of the first embodiment. In the present embodiment, however, the positive electrode metal plate 30 and the output metal plate 70 have the same size, differently from the first embodiment. The positive electrode metal plate 30 corresponds to the first metal plate. The output metal plate 70 corresponds to a second metal plate.

The positive electrode metal plate 30 is arranged to face both the first semiconductor element 11 and the second semiconductor element 12, and is electrically connected to the positive electrode terminal 315. The positive electrode metal plate 30 is electrically and mechanically connected to the positive electrode terminal 315 via solder. In the present disclosure, the positive electrode terminal 315 and the negative electrode terminal 415 may not be arranged at positions biased toward the second semiconductor element 12 with respect to the first semiconductor element 11. In the present disclosure, further, the positive electrode terminal 315 and the negative electrode terminal 415 may not be arranged to face each other.

The output metal plate 70 is arranged to face both the first semiconductor element 11 and the second semiconductor element 12 in a state where the first semiconductor element 11 and the second semiconductor element 12 are arranged between the positive electrode metal plate 30 and the output metal plate 70. As shown in FIG. 10, the output metal plate 70 is provided with an output terminal 71.

The sealing resin body 20 covers the first semiconductor element 11, the second semiconductor element 12, the positive electrode metal plate 30, and the output metal plate 70, as in the first embodiment. The surface of the positive electrode metal plate 30 opposite to the facing surface facing the first and second semiconductor elements 11 and 12 is exposed from the sealing resin body 20. Also, the surface of the output metal plate 70 opposite to the facing surface facing the first and second semiconductor elements 11 and 12 is exposed from the sealing resin body 20.

The first semiconductor element 11 has the emitter electrode on the side adjacent to the output metal plate 70, and the emitter electrode is electrically connected to the output metal plate 70. More specifically, the emitter electrode of the first semiconductor element 11 is electrically and mechanically connected to the terminal member 80 via solder. The terminal member 80 is electrically and mechanically connected to the output metal plate 70 via solder.

Further, the first semiconductor element 11 has the collector electrode on the side adjacent to the positive electrode metal plate 30, and the collector electrode is electrically connected to the positive electrode metal plate 30 via solder. The positive electrode metal plate 30 is electrically connected to the positive electrode terminal 315 as described above. Therefore, the collector electrode of the first semiconductor element 11 is electrically connected to the positive electrode metal plate 30 via the positive electrode metal plate 30.

In the second semiconductor element 12, the collector electrode, which is an electrode on the output metal plate 70 side, is electrically connected to the output metal plate 70 via solder. Further, in the second semiconductor element 12, the emitter electrode, which is an electrode on the positive electrode metal plate 30 side, is electrically connected to the negative electrode terminal 415 via solder. As described above, the negative electrode terminal 415 is electrically insulated from the positive electrode terminal 315 and the positive electrode metal plate 30 by the insulated substrate 515. Therefore, the emitter electrode of the second semiconductor element 12 is thermally connected to the positive electrode metal plate 30 by the insulated substrate 515 in a state of being electrically insulated.

An operation of the semiconductor device 105 will be described with reference to FIGS. 10 to 12. In FIGS. 10 to 12, broken line arrows indicate a schematic current flow (current path).

In the semiconductor device 105, a current flows from the positive electrode terminal 315 to the negative electrode terminal 415. More specifically, the semiconductor device 105 has a current path in which the current flows in order of the positive electrode terminal 315, the positive electrode metal plate 30, the first semiconductor element 11, the terminal member 80, the output metal plate 70, the semiconductor element 12, and the negative electrode 415.

Further, the current path in the positive electrode terminal 315 faces the current path in the negative electrode terminal 415, and the flow direction of the current path in the positive electrode terminal 315 is opposite to the flow direction of the current path in the negative electrode terminal 415. Further, the current path in the positive electrode metal plate 30 faces the current path in the output metal plate 70, and the flow direction of the current path in the positive electrode metal plate 30 is opposite to the flow direction of the current path in the output metal plate 70. Therefore, the semiconductor device 105 can achieve the similar effects to those of the semiconductor device 101.

In the semiconductor device 101 described above, for example, the two metal plates, that is, the positive electrode metal plate 30 and the output metal plate 70 are arranged on one side facing the first and second semiconductor elements 11 and 12. In the semiconductor device 101, therefore, it is necessary to secure insulation between the positive electrode metal plate 30 and the output metal plate 70. To ensure the insulation, the positive electrode metal plate 30 and the output metal plate 70 are arranged apart from each other in the semiconductor device 101. That is, the semiconductor device 101 needs an insulating space for insulating the positive electrode metal plate 30 and the output metal plate 70 from each other.

In the semiconductor device 105, on the other hand, the positive electrode metal plate 30 is arranged on one side facing each of the first and second semiconductor elements 11 and 12, and the output metal plate 70 is arranged on the other side. Since the metal plates are not arranged in the X direction, it is not necessary to secure the insulation between the metal plates arranged in the X direction.

Since the semiconductor device 105 does not need the insulating space in the X direction, the semiconductor device 105 can be made smaller in body size than the semiconductor device 101. The alternate long and short dash line in FIG. 10 shows the difference in body size between the semiconductor device 101 and the semiconductor device 105 in the X direction.

(First Modification)

Figure 13:
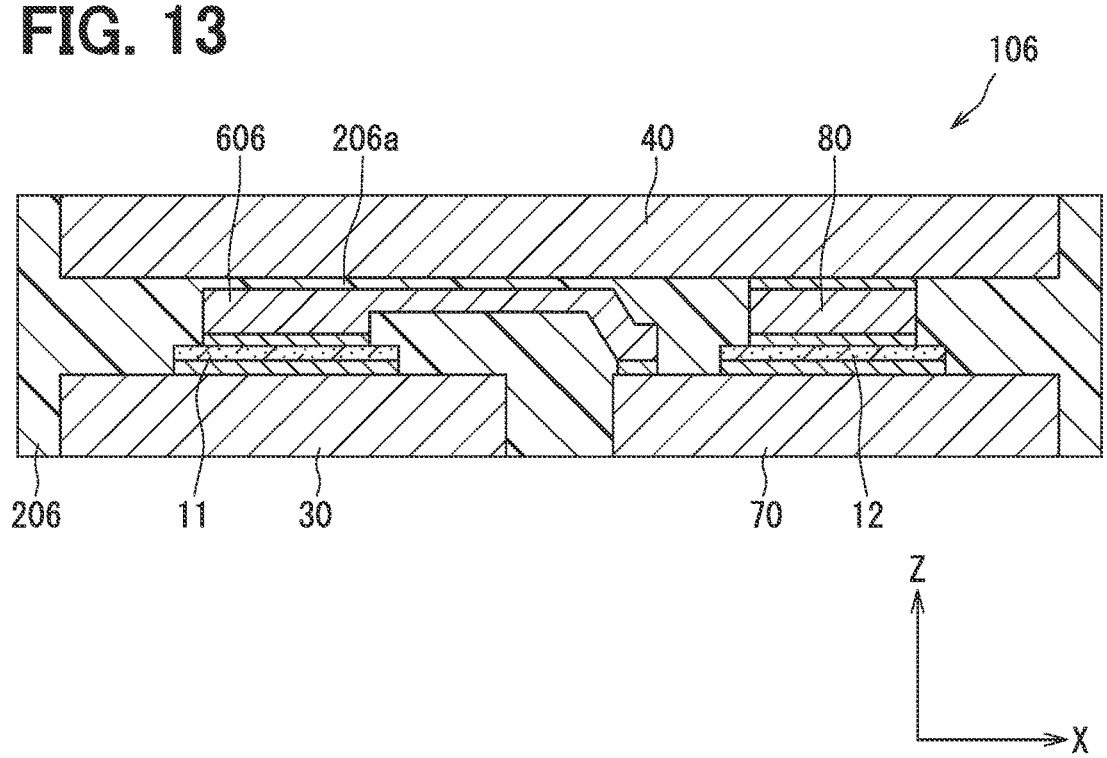
FIG. 13 is a cross-sectional view showing a schematic configuration of a semiconductor device according to a first modification.

A semiconductor device 106 as a first modification will be described with reference to FIG. 13. The semiconductor device 106 is different from the semiconductor device 101 mainly on the point that the member insulating the emitter electrode of the first semiconductor element 11 from the negative electrode metal plate 40 is different from that of the semiconductor device 101. FIG. 13 is a cross sectional view corresponding to FIG. 3.

The semiconductor device 106 includes a connecting member 606 made of the same material as the positive electrode metal plate 30. The connecting member 606 is a member that electrically connects the emitter electrode of the first semiconductor element 11 and the output metal plate 70 to each other. That is, the semiconductor device 106 includes the connecting member 606, in place of the first metal body 62.

A sealing resin body 206 covers the first and second semiconductor elements 11 and 12 and the like, similarly to the sealing resin body 20. However, the sealing resin body 206 includes an intervening portion 206a formed between the connecting member 606 and a negative electrode metal plate 40. The connecting member 606 and the negative electrode metal plate 40 are electrically insulated by the intervening portion 206a. That is, the emitter electrode of the first semiconductor element 11 is electrically insulated from the negative electrode metal plate 40 by the intervening portion 206a.

The thickness of the intervening portion 206a may be such that the connecting member 606 and the negative electrode metal plate 40 can be electrically insulated, and the heat generated by the first semiconductor element 11 is transferred to the negative electrode metal plate 40. Further, the thickness of the intervening portion 206a is preferably as thin as possible within the range where the connecting member 606 and the negative electrode metal plate 40 can be electrically insulated from each other, so the heat generated by the first semiconductor element 11 is readily transferred to the negative electrode metal plate 40. The intervening portion 206a corresponds to the insulator.

The semiconductor device 106 can achieve the similar effects to those of the semiconductor device 101. Further, the semiconductor device 106 can secure the electrical insulation property by the sealing resin body 206 without having the insulated wiring board.

(Second Modification)

Figure 14:
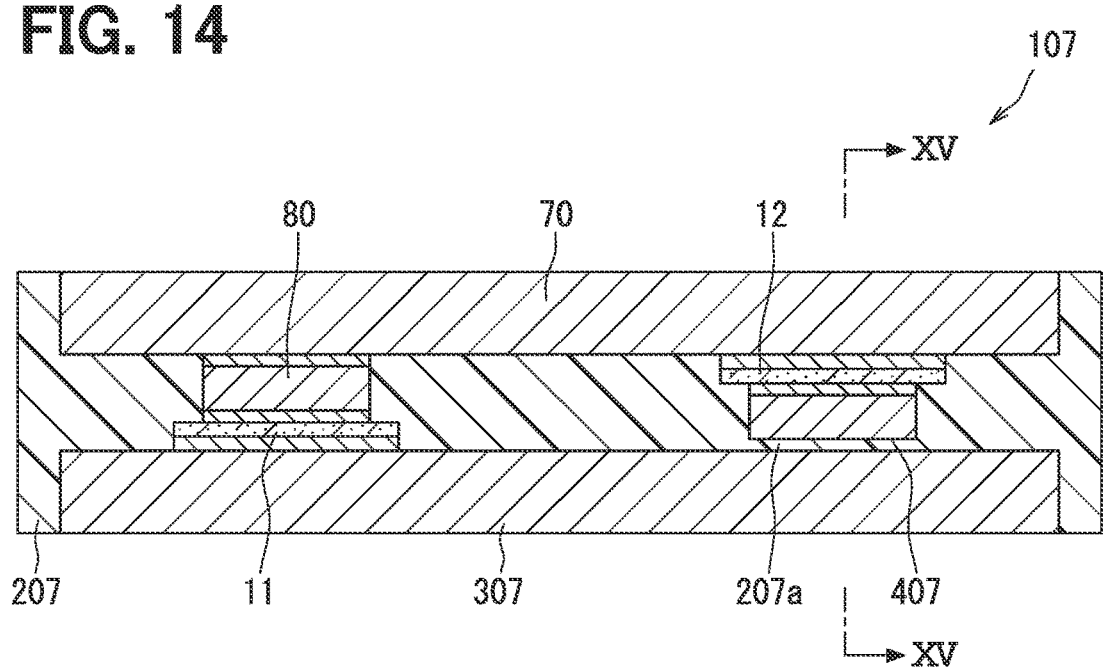
FIG. 14 is a cross-sectional view showing a schematic configuration of a semiconductor device according to a second modification.
Figure 15:
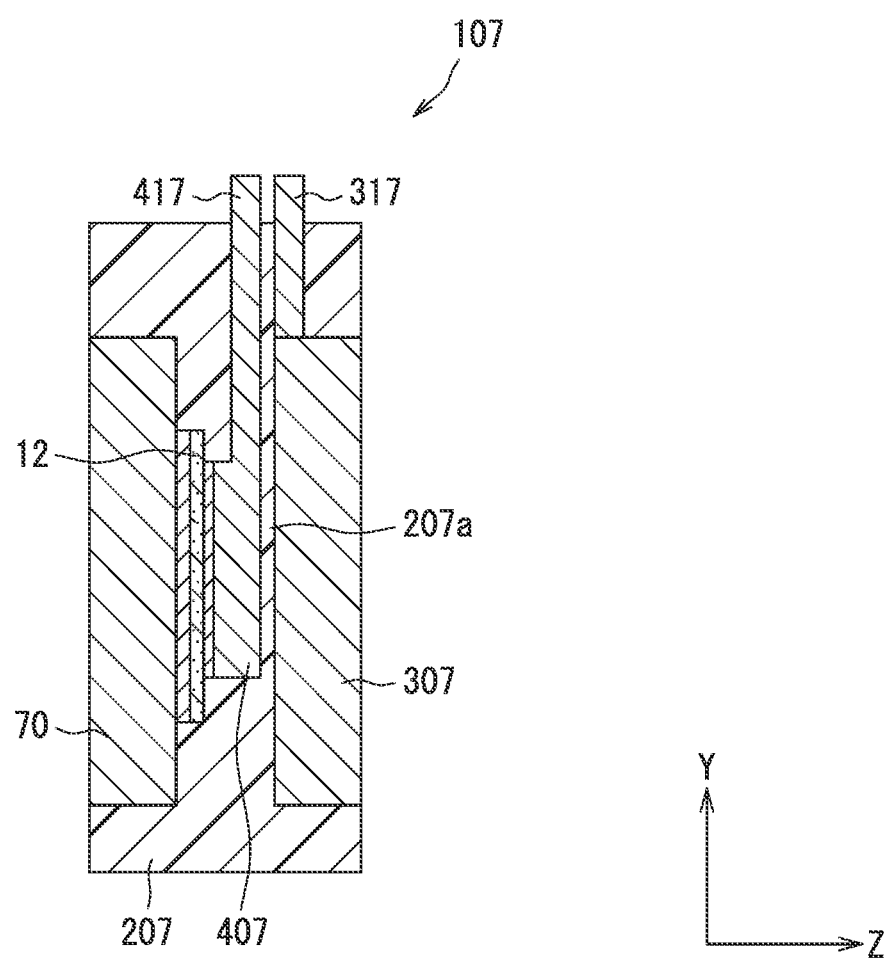
FIG. 15 is a cross-sectional view showing a schematic configuration of the semiconductor device according to the second modification.

A semiconductor device 107 as a second modification will be described with reference to FIGS. 14 and 15. The semiconductor device 107 is different from the semiconductor device 105 mainly on the point that the member insulating the emitter electrode of the second semiconductor element 12 from a positive electrode metal plate 307 is different from that of the semiconductor device 105. FIG. 14 is a cross-sectional view corresponding to FIG. 12. FIG. 15 is a cross-sectional view corresponding to FIG. 11.

As shown in FIG. 15, the semiconductor device 107 includes a metal member in which the positive electrode metal plate 307 and a positive electrode terminal 317 are integrally formed, and a metal member in which a negative electrode metal plate 407 and a negative electrode terminal 417 are integrally formed. These metal members are made of the same material as the positive electrode metal plate 30 and the like.

The negative electrode metal plate 407 is arranged to face the emitter electrode of the second semiconductor element 12. The negative electrode metal plate 407 is electrically connected to the emitter electrode of the second semiconductor element 12 via solder. Further, a surface of the negative electrode metal plate 407, which is opposite to a surface thereof facing the emitter electrode of the second semiconductor element 12, faces the positive electrode metal plate 307.

As shown in FIGS. 14 and 15, a sealing resin body 207 covers the first and second semiconductor elements 11 and 12 and the like, similarly to the sealing resin body 20. However, the sealing resin body 207 includes an intervening portion 207a interposed between the positive electrode metal plate 307 and the negative electrode metal plate 407. The positive electrode metal plate 307 and the negative electrode metal plate 407 are electrically insulated from each other by the intervening portion 207a. That is, the emitter electrode of the second semiconductor element 12 is electrically connected to the negative electrode metal plate 407, and the second semiconductor element 12 is electrically insulated from the positive electrode metal plate 307 by the intervening portion 207a.

The thickness of the intervening portion 207a may be such that the positive electrode metal plate 307 and the negative electrode metal plate 407 can be electrically insulated from each other and the heat generated by the second semiconductor element 12 can be transferred to the positive electrode metal plate 307. Further, the thickness of the intervening portion 207a is preferably as thin as possible within the range where the positive electrode metal plate 307 and the negative electrode metal plate 407 can be electrically insulated, so that the heat generated by the second semiconductor element 12 is readily transferred to the positive electrode metal plate 307. The intervening portion 207a corresponds to the insulator.

The semiconductor device 107 can achieve the similar effects to those of the semiconductor device 101. Further, the semiconductor device 107 can secure the electrical insulation property by the sealing resin body 207 without having the insulated wiring board.

(Third Modification)

Figure 16:
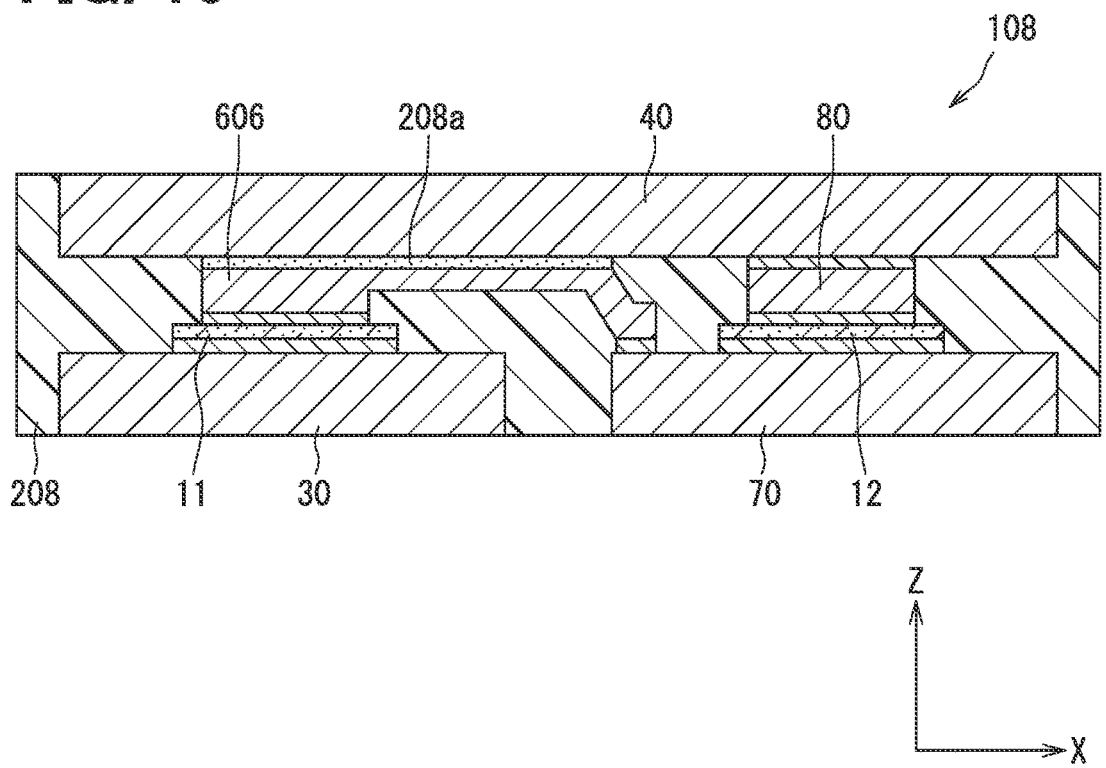
FIG. 16 is a cross-sectional view showing a schematic configuration of a semiconductor device according to a third modification.

A semiconductor device 108 as a third modification will be described with reference to FIG. 16. The semiconductor device 108 is different from the semiconductor device 106 mainly on the point that a member insulating the emitter electrode of the first semiconductor element 11 from the negative electrode metal plate 40 is different from that of the semiconductor device 106. FIG. 16 is a cross-sectional view corresponding to FIG. 3.

In the semiconductor device 108, a connecting member 606 and the negative electrode metal plate 40 are mechanically connected by an insulating adhesive 208a. Thus, the connecting member 606 and the negative electrode metal plate 40 are electrically insulated by the insulating adhesive 208a. That is, the emitter electrode of the first semiconductor element 11 is electrically insulated from the negative electrode metal plate 40 by the insulating adhesive 208a. The insulating adhesive 208a corresponds to the insulator.

The insulating adhesive 208a preferably has a higher the thermal conductivity so as to improve thermal connection between the emitter electrode of the first semiconductor element 11 and the negative electrode metal plate 40. That is, the insulating adhesive 208a having a higher thermal conductivity is preferable because the higher the thermal conductivity is, the more the heat generated by the first semiconductor element 11 is readily transferred to the negative electrode metal plate 40.

The semiconductor device 108 can achieve the similar effect to those of the semiconductor device 106. Further, the semiconductor device 108 electrically insulates the connecting member 606 and the negative electrode metal plate 40 from each other with the insulating adhesive 208a, which is a member different from the sealing resin body 206. In the semiconductor device 108, therefore, the heat transfer between the emitter electrode of the first semiconductor element 11 and the negative electrode metal plate 40 can be adjusted easier than the semiconductor device 106.

(Fourth Modification)

Figure 17:
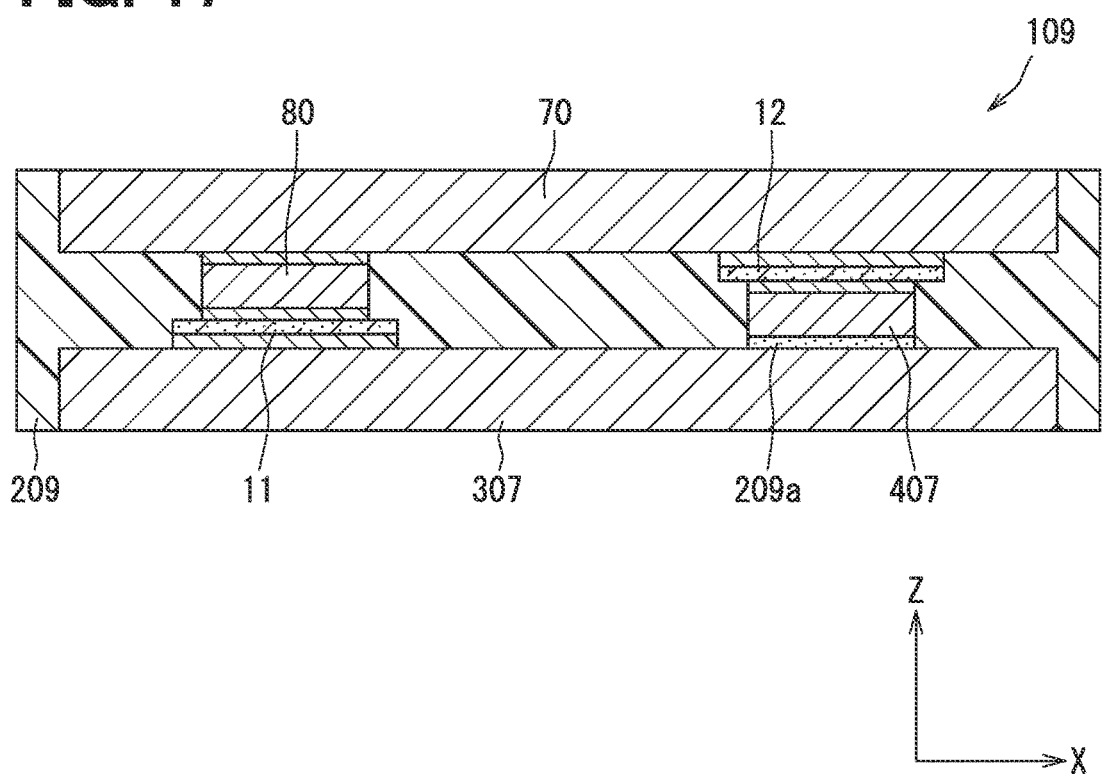
FIG. 17 is a cross-sectional view showing a schematic configuration of a semiconductor device according to a fourth modification.

A semiconductor device 109 as a fourth modification will be described with reference to FIG. 17. The semiconductor device 109 is different from the semiconductor device 107 on the point that the member insulating a positive electrode metal plate 307 and a negative electrode metal plate 407 from each other is different from that of the semiconductor device 107. FIG. 17 is a cross sectional view corresponding to FIG. 14.

In the semiconductor device 109, the positive electrode metal plate 307 and the negative electrode metal plate 407 are mechanically connected by an insulating adhesive 209a. As described above, the positive electrode metal plate 307 and the negative electrode metal plate 407 are electrically insulated by the insulating adhesive 209a. That is, the emitter electrode of the second semiconductor element 12 is electrically insulated from the positive electrode metal plate 307 by the insulating adhesive 209a. The insulating adhesive 209a is the same material as the insulating adhesive 208a. The insulating adhesive 209a corresponds to the insulator.

The semiconductor device 109 can achieve the similar effects to those of the semiconductor device 107. Further, in the semiconductor device 109, the positive electrode metal plate 307 and the negative electrode metal plate 407 are electrically insulated from each other with the insulating adhesive 209a, which is a member different from the sealing resin body 209. In the semiconductor device 109, therefore, the heat transfer between the emitter electrode of the second semiconductor element 12 and the positive electrode metal plate 307 can be adjusted easier than the semiconductor device 107.

Figure 18:
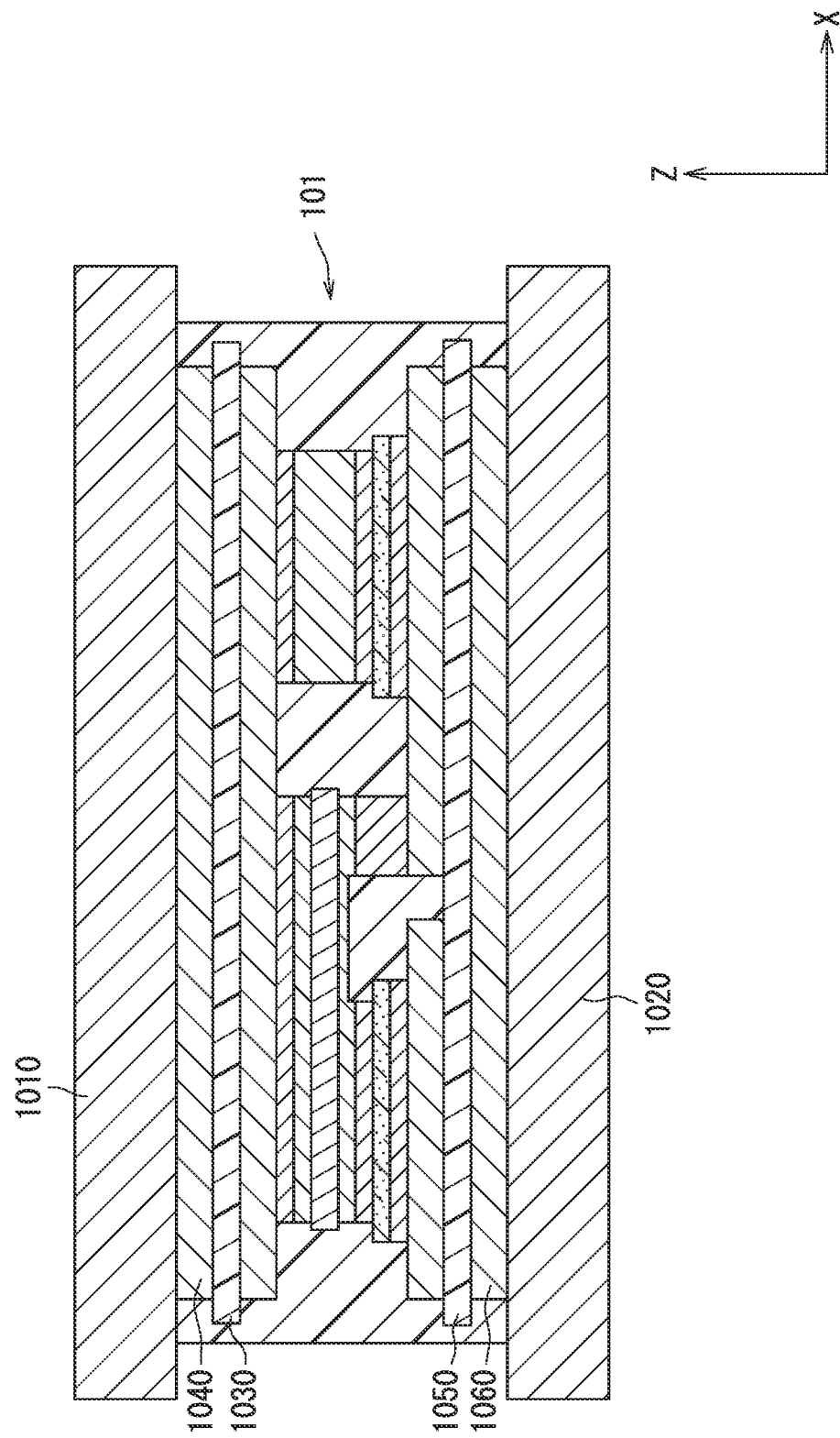
FIG. 18 is a cross-sectional view showing a schematic configuration of a semiconductor device according to a fifth modification.
Figure 19:
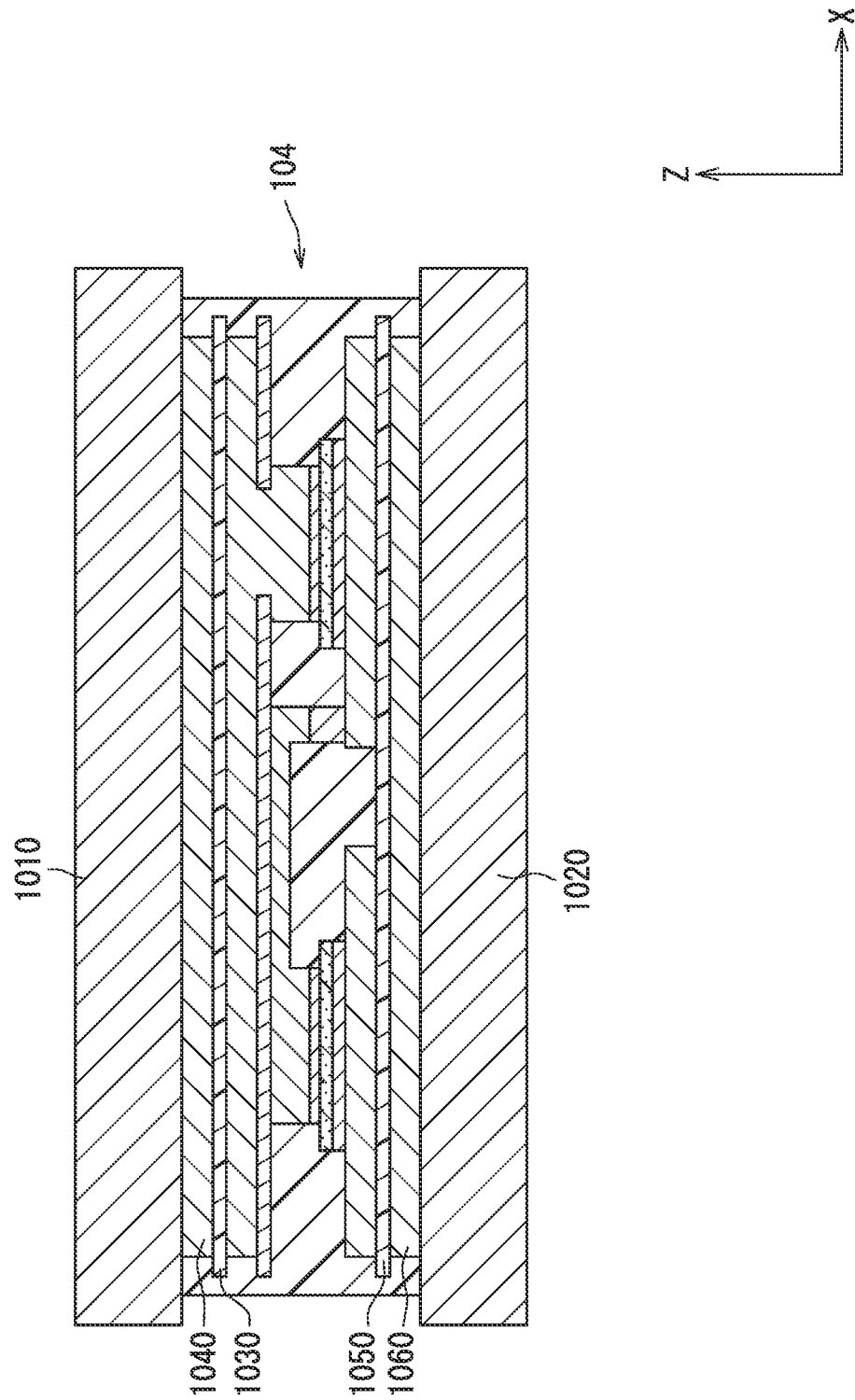
FIG. 19 is a cross-sectional view showing a schematic configuration of a semiconductor device according to a sixth modification.
Figure 20:
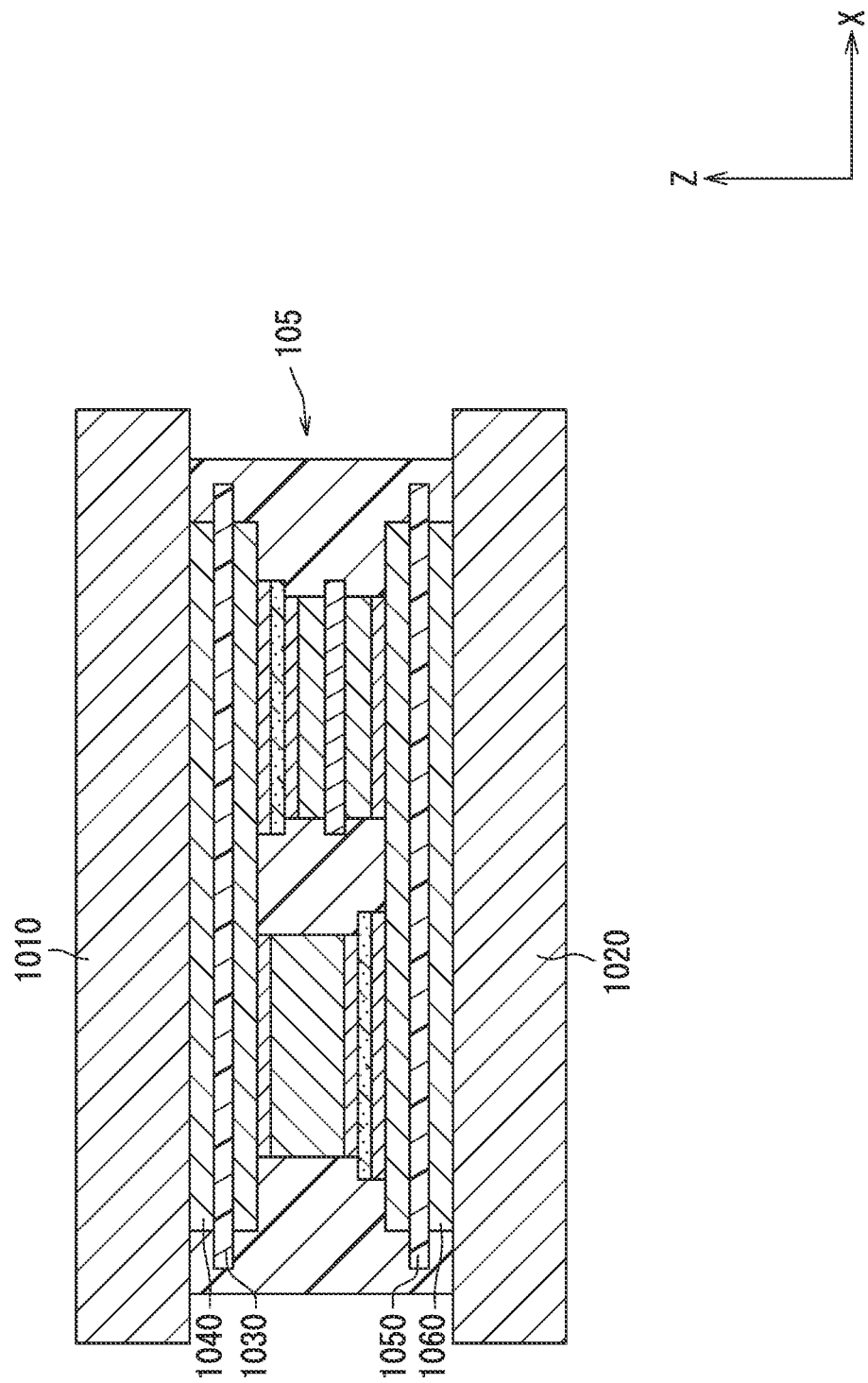
FIG. 20 is a cross-sectional view showing a schematic configuration of a semiconductor device according to a seventh modification.

The semiconductor device described so far may be attached to coolers 1010 and 1020. With reference to FIGS. 18, 19, and 20, fifth, sixth and seventh modifications 5, 6 and 7 will be described each as an example of a structure in which the semiconductor device is attached to the coolers 1010 and 1020. The structure in which the semiconductor device is attached to the coolers 1010 and 1020 can be referred to as a semiconductor module. For example, the coolers 1010 and 1020 may be provided by those described in JP 2018-101666 A as incorporation by reference.

In the fifth modification, as shown in FIG. 18, the semiconductor device 101 is attached to a first cooler 1010 and a second cooler 1020. FIG. 18 is a cross sectional view corresponding to FIG. 3.

The first cooler 1010 and the second cooler 1020 are made of a metal such as copper or aluminum. Each of the first cooler 1010 and the second cooler 1020 forms a flow path through which a refrigerant such as cooling water flows. The semiconductor device 101 is interposed between the first cooler 1010 and the second cooler 1020.

In the semiconductor device 101, a first insulator 1030, a first outer metal body 1040, and the first cooler 1010 are stacked in this order on the negative electrode metal plate 40. In the semiconductor module, the negative electrode metal plate 40 and the first insulator 1030 are in contact with each other, and the first insulator 1030 and the first outer metal body 1040 are in contact with each other. Also, the first outer metal body 1040 and the first cooler 1010 are in contact with each other. In the semiconductor device 101, the negative electrode metal plate 40 and the first cooler 1010 are electrically insulated by the first insulator 1030. The negative electrode metal plate 40, the first insulator 1030, and the first outer metal body 1040 may be formed of an insulated wiring board.

In the semiconductor device 101, the first insulator 1030, the first outer metal body 1040, and the first cooler 1010 are stacked in this order on the negative electrode metal plate 40. Therefore, in the semiconductor device 101, the negative electrode metal plate 40 and the first cooler 1010 are electrically insulated by the first insulator 1030. The negative electrode metal plate 40, the first insulator 1030, and the first outer metal body 1040 may be formed of an insulated wiring board.

In the semiconductor device 101, a second insulator 1050, a second outer metal body 1060, and the second cooler 1020 are stacked in this order on the positive electrode metal plate 30 and the output metal plate 70. In the semiconductor module, the positive electrode metal plate 30 and the output metal plate 70 are in contact with the second insulator 1050, and the second insulator 1050 and the second outer metal body 1060 are in contact with each other. Also, the second outer metal body 1060 and the second cooler 1020 are in contact with each other. In the semiconductor device 101, the positive electrode metal plate 30 and the output metal plate 70 are electrically insulated from the second cooler 1020 by the second insulator 1050. The positive electrode metal plate 30, the output metal plate 70, the second insulator 1050, and the second outer metal body 1060 may be formed of an insulated wiring board.

As a result, the semiconductor device 101 can be cooled by the first and second coolers 1010 and 1020 while being electrically insulated from the first and second coolers 1010 and 1020.

As shown in FIG. 19, the sixth modification has a structure in which the semiconductor device 104 is attached to the first cooler 1010 and the second cooler 1020. FIG. 19 is a cross-sectional view corresponding to FIGS. 8 and 9. The semiconductor module of the sixth modification is different from the semiconductor module of the fifth embodiment as having the semiconductor device 104, in place of the semiconductor device 101 of the fifth modification. Therefore, the semiconductor module of the sixth modification can achieve the similar effects to those of the fifth modification.

As shown in FIG. 20, the seventh modification has a structure in which the semiconductor device 105 is attached to the first cooler 1010 and the second cooler 1020. FIG. 20 is a cross sectional view corresponding to FIG. 12. The semiconductor module of the seventh modification is different from the semiconductor module of the fifth embodiment as having the semiconductor device 105, in place of the semiconductor device 101 of the fifth modification. Therefore, the semiconductor module of the seventh modification can achieve the similar effects to those of the fifth modification.

What is claimed is:

1. A semiconductor device comprising:
   a first semiconductor element;
   a second semiconductor element connected in series with the first semiconductor element;
   a first terminal;
   a second terminal, the second terminal and the first terminal allowing a current to flow between the second terminal and the first terminal;
   a first metal plate arranged to face both the first semiconductor element and the second semiconductor element and electrically connected to the second terminal;
   a second metal plate arranged to face the first metal plate and to interpose the first semiconductor element between the first metal plate and the second metal plate, and electrically connected to the first terminal;
   a third metal plate arranged to face the first metal plate and to interpose the second semiconductor element between the first metal plate and the third metal plate; and
   a sealing resin body covering the first semiconductor element, the second semiconductor element, the first metal plate, the second meal plate and the third metal plate, wherein
   the second semiconductor element has a first electrode on a surface adjacent to the third metal plate and electrically connected to the third metal plate, and a second electrode on a surface adjacent to the first metal plate and electrically connected to the first metal plate,
   the first semiconductor element has a first electrode on a surface adjacent to the second metal plate and electrically connected to the second metal plate, and a second electrode on a surface adjacent to the first metal plate and electrically connected to the third metal plate,
   the first semiconductor element is thermally connected to the first metal plate while being electrically insulated from the first metal plate by an insulator, the first metal plate has an exposed surface exposed from the sealing resin body on a side opposite to the first semiconductor element and the second semiconductor element,
   the second metal plate has an exposed surface exposed from the sealing resin body on a side opposite to the first semiconductor element, and
   the third metal plate has an exposed surface exposed from the sealing resin body on a side opposite to the second semiconductor element.

2. The semiconductor device according to claim 1, wherein
   the first terminal is arranged at a position biased toward the first semiconductor element with respect to the second semiconductor element, and
   the second terminal is arranged to face the first terminal.

3. The semiconductor device according to claim 1, further comprising:
   an insulated wiring board including an insulated plate, a first metal body disposed on a first surface of the insulated plate and a second metal body disposed on a second surface of the insulated plate opposite to the first surface, wherein
   the first metal body includes the first terminal, and
   the second metal body includes the second terminal.

4. The semiconductor device according to claim 1, further comprising:
   an insulated wiring board including an insulated plate, a first metal body disposed on a first surface of the insulated plate and a second metal body disposed on a second surface of the insulated plate opposite to the first surface, wherein
   the insulated plate includes the insulator.

5. The semiconductor device according to claim 1, further comprising:
   an insulated wiring board including an insulated plate, a first metal body disposed on a first surface of the insulated plate and a second metal body disposed on a second surface of the insulated plate opposite to the first surface, wherein
   the insulated plate includes the insulator,
   the first metal body includes the first terminal, and
   the second metal body includes the second terminal.

6. The semiconductor device according to claim 4, wherein
   the insulated plate is formed with a through hole, and
   the first metal body and the second metal body are electrically connected to each other via the through hole.

7. The semiconductor device according to claim 4, further comprising:
   a signal terminal, wherein
   at least one of the first metal body and the second metal body includes a signal metal body electrically connected to the signal terminal.

8. A semiconductor device comprising:
   a first semiconductor element;
   a second semiconductor element connected in series with the first semiconductor element;
   a first terminal;
   a second terminal, the second terminal and the first terminal allowing a current to flow between the second terminal and the first terminal;
   a first metal plate arranged to face both the first semiconductor element and the second semiconductor element and electrically connected to the first terminal; and
   a second metal plate arranged to face both the first semiconductor element and the second semiconductor element and to interpose the first semiconductor element and the second semiconductor element between the first metal plate and the second metal plate, wherein
   the first semiconductor element has a first electrode on a surface adjacent to the first metal plate and electrically connected to the first metal plate, and a second electrode on a surface adjacent to the second metal plate and electrically connected to the second metal plate, the first semiconductor element is electrically connected to the first terminal via the first metal plate, the second semiconductor element has a first electrode on a surface adjacent to the second metal plate and electrically connected to the second metal plate, and a second electrode on a surface adjacent to the first metal plate and electrically connected to the second terminal, and the second semiconductor element is thermally connected to the first metal plate while being insulated from the first metal plate by an insulator.

9. The semiconductor device according to claim 8, further comprising:

a sealing resin body covering the first semiconductor element, the second semiconductor element, the first metal plate and the second metal plate, wherein the first metal plate has an exposed surface exposed from the sealing resin body on a side opposite to the first semiconductor element and the second semiconductor element, and the second metal plate has an exposed surface exposed from the sealing resin body on a side opposite to the first semiconductor element and the second semiconductor element.

10. The semiconductor device according to claim 8, wherein the second terminal is arranged to face the first terminal at a position biased toward the second semiconductor element with respect to the first semiconductor element.

11. The semiconductor device according to claim 8, further comprising:

an insulated wiring board including an insulated plate, a first metal body disposed on a first surface of the insulated plate and a second metal body disposed on a second surface of the insulated plate opposite to the first surface, wherein the first metal body includes the first terminal, and the second metal body includes the second terminal.

12. The semiconductor device according to claim 8, further comprising:

an insulated wiring board including an insulated plate, a first metal body disposed on a first surface of the insulated plate and a second metal body disposed on a second surface of the insulated plate opposite to the first surface, wherein the insulated plate includes the insulator.

13. The semiconductor device according to claim 8, further comprising:

an insulated wiring board including an insulated plate, a first metal body disposed on a first surface of the insulated plate and a second metal body disposed on a second surface of the insulated plate opposite to the first surface, wherein the insulated plate includes the insulator, the first metal body includes the first terminal, and the second metal body includes the second terminal.

14. The semiconductor device according to claim 12, wherein the insulated plate is formed with a through hole, and the first metal body and the second metal body are electrically connected to each other via the through hole.

15. The semiconductor device according to claim 12, further comprising:

a signal terminal, wherein at least one of the first metal body and the second metal body includes a signal metal body electrically connected to the signal terminal.

16. A semiconductor device comprising:

a first semiconductor element;

a second semiconductor element connected in series with the first semiconductor element;

a first terminal;

a second terminal, the second terminal and the first terminal allowing a current to flow between the second terminal and the first terminal;

a first metal plate arranged to face both the first semiconductor element and the second semiconductor element and electrically connected to the second terminal;

a second metal plate arranged to face the first metal plate and to interpose the first semiconductor element between the first metal plate and the second metal plate, and electrically connected to the first terminal; and a third metal plate arranged to face the first metal plate and to interpose the second semiconductor element between the first metal plate and the third metal plate, wherein the second semiconductor element has a first electrode on a surface adjacent to the third metal plate and electrically connected to the third metal plate, and a second electrode on a surface adjacent to the first metal plate and electrically connected to the first metal plate, the first semiconductor element has a first electrode on a surface adjacent to the second metal plate and electrically connected to the second metal plate, and a second electrode on a surface adjacent to the first metal plate and electrically connected to the third metal plate, and the first semiconductor element is thermally connected to the first metal plate while being electrically insulated from the first metal plate by an insulator, the semiconductor device further comprising:

an insulated wiring board including an insulated plate, a first metal body disposed on a first surface of the insulated plate and a second metal body disposed on a second surface of the insulated plate opposite to the first surface, wherein the insulator is provided by the insulated plate.

17. A semiconductor device comprising:

a first semiconductor element;

a second semiconductor element connected in series with the first semiconductor element;

a first terminal;

a second terminal, the second terminal and the first terminal allowing a current to flow between the second terminal and the first terminal;

a first metal plate arranged to face both the first semiconductor element and the second semiconductor element and electrically connected to the second terminal;

a second metal plate arranged to face the first metal plate and to interpose the first semiconductor element between the first metal plate and the second metal plate, and electrically connected to the first terminal; and a third metal plate arranged to face the first metal plate and to interpose the second semiconductor element between the first metal plate and the third metal plate, wherein the second semiconductor element has a first electrode on a surface adjacent to the third metal plate and electrically connected to the third metal plate, and a second electrode on a surface adjacent to the first metal plate and electrically connected to the first metal plate, the first semiconductor element has a first electrode on a surface adjacent to the second metal plate and electrically connected to the second metal plate, and a second electrode on a surface adjacent to the first metal plate and electrically connected to the third metal plate, and the first semiconductor element is thermally connected to the first metal plate while being electrically insulated from the first metal plate by an insulator, the semiconductor device further comprising:

an insulated wiring board including an insulated plate, a first metal body disposed on a first surface of the insulated plate and a second metal body disposed on a second surface of the insulated plate opposite to the first surface, wherein the first terminal is provided by the first metal body, and the second terminal is provided by the second metal body.

18. The semiconductor device according to claim 17, wherein the insulator is provided by the insulated plate.

19. A semiconductor device comprising:

a first semiconductor element;

a second semiconductor element connected in series with the first semiconductor element;

a first terminal;

a second terminal, the second terminal and the first terminal allowing a current to flow between the second terminal and the first terminal;

a first metal plate arranged to face both the first semiconductor element and the second semiconductor element and electrically connected to the second terminal;

a second metal plate arranged to face the first metal plate and to interpose the first semiconductor element between the first metal plate and the second metal plate, and electrically connected to the first terminal;

a third metal plate arranged to face the first metal plate and to interpose the second semiconductor element between the first metal plate and the third metal plate; and an insulated wiring board including an insulated plate, a first metal body disposed on a first surface of the insulated plate and a second metal body disposed on a second surface of the insulated plate opposite to the first surface, wherein the second semiconductor element has a first electrode on a surface adjacent to the third metal plate and electrically connected to the third metal plate, and a second electrode on a surface adjacent to the first metal plate and electrically connected to the first metal plate, the first semiconductor element has a first electrode on a surface adjacent to the second metal plate and electrically connected to the second metal plate, and a second electrode on a surface adjacent to the first metal plate and electrically connected to the third metal plate, the first semiconductor element is thermally connected to the first metal plate while being electrically insulated from the first metal plate by an insulator, the first metal body includes a connecting portion that electrically connects between the second electrode of the first semiconductor element adjacent to the first metal plate and the third metal plate, the connecting portion includes a first facing portion that faces the second electrode of the first semiconductor element and a second facing portion that faces the third metal plate, and the connecting portion is formed with a recess at a position between the first facing portion and the second facing portion, the recess being recessed from the first and second facing portions.

20. The semiconductor device according to claim 19, further comprising:

a sealing resin body covering the first semiconductor element, the second semiconductor element, the first metal plate, the second meal plate and the third metal plate, wherein the first metal plate has an exposed surface exposed from the sealing resin body on a side opposite to the first semiconductor element and the second semiconductor element, the second metal plate has an exposed surface exposed from the sealing resin body on a side opposite to the first semiconductor element, and the third metal plate has an exposed surface exposed from the sealing resin body on a side opposite to the second semiconductor element.

* * * * *